US008877828B2

(12) United States Patent
Enomoto et al.

(10) Patent No.: US 8,877,828 B2
(45) Date of Patent: Nov. 4, 2014

(54) METHOD FOR PRODUCING CURABLE COMPOSITION FOR IMPRINTS

(75) Inventors: Yuichiro Enomoto, Haibara-gun (JP); Kunihiko Kodama, Haibara-gun (JP); Shinji Tarutani, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 108 days.

(21) Appl. No.: 13/371,088

(22) Filed: Feb. 10, 2012

(65) Prior Publication Data

US 2012/0207943 A1  Aug. 16, 2012

(30) Foreign Application Priority Data

Feb. 15, 2011 (JP) ................... 2011-029436

(51) Int. Cl.
| | |
|---|---|
| C08F 2/46 | (2006.01) |
| C08F 20/18 | (2006.01) |
| G03F 7/00 | (2006.01) |
| B82Y 10/00 | (2011.01) |
| G03F 7/16 | (2006.01) |
| B82Y 40/00 | (2011.01) |

(52) U.S. Cl.
CPC ............... *G03F 7/0002* (2013.01); *B82Y 10/00* (2013.01); *G03F 7/16* (2013.01); *B82Y 40/00* (2013.01)
USPC ................. 522/182; 522/187; 526/77; 526/89

(58) Field of Classification Search
USPC ......................................................... 526/77
See application file for complete search history.

(56) References Cited

U.S. PATENT DOCUMENTS

| | | | |
|---|---|---|---|
| 4,323,074 A | 4/1982 | Nelms | |
| 5,032,108 A | 7/1991 | Taniguchi et al. | |
| 5,169,965 A | 12/1992 | Fujiwa et al. | |
| 5,198,509 A | 3/1993 | Fujiwa et al. | |
| 5,259,926 A | 11/1993 | Kuwabara et al. | |
| 5,338,879 A | 8/1994 | Fujiwa et al. | |
| 5,378,736 A | 1/1995 | Fujiwa et al. | |
| 5,772,905 A | 6/1998 | Chou | |
| 5,956,216 A | 9/1999 | Chou | |
| 7,198,968 B2 | 4/2007 | Chae et al. | |
| 7,821,586 B2 | 10/2010 | Kim | |
| 2005/0142714 A1 | 6/2005 | Chae et al. | |
| 2005/0231669 A1 | 10/2005 | Kim | |
| 2011/0120937 A1* | 5/2011 | Ishizuka et al. | ............ 210/493.1 |

FOREIGN PATENT DOCUMENTS

| | | | | |
|---|---|---|---|---|
| JP | 11-100378 | A | 4/1999 | |
| JP | 2906245 | B2 | 6/1999 | |
| JP | 2926262 | B2 | 7/1999 | |
| JP | 2004-143281 | A | 5/2004 | |
| JP | 2004-240241 | A | 8/2004 | |
| JP | 2005-197699 | A | 7/2005 | |
| JP | 2005-301289 | A | 10/2005 | |
| JP | 2008-105414 | A | 5/2008 | |
| JP | 2009-73078 | A | 4/2009 | |
| JP | 2010-287793 | A | 12/2010 | |
| WO | WO 2010064726 | A2 * | 6/2010 | ................ C08F 2/48 |
| WO | WO 2011126101 | A1 * | 10/2011 | ............ H01L 21/027 |

OTHER PUBLICATIONS

Extended European Search Report dated Aug. 9, 2013 in European Application No. 12155082.6.
"Lecture of Experimental Chemistry 20", Maruzen, 1992, pp. 213-224, 4th Ed., Organic Synthesis II.
Alfred Hassner, Ed., "The Chemistry of Hetrocyclic Compounds—Small Ring Heterocycles: Part 3, Oxiranes, Arene Oxides, Oxaziridines, Dioxetanes, Thietanes, Thietes, Thiazetes, and Others", An Interscience Publication, 1985, pp. 1-196, John Wiley and Sons, Inc., New York.
M. Colburn et al., "Step and Flash Imprint Lithography: A New Approach to High-Resolution Patterning", SPIE, 1999, pp. 379-389, vol. 3676, Santa Clara, CA.
Stephen Chou et al., "Imprint of sub-25 nm vias and trenches in polymers", Appl. Phys. Lett., 1995, pp. 3114-3116, vol. 67, No. 21.
Stephen Lapin, "Vinyl Ether Functionalized Urethane Oligomers: An Alternative to Acrylate Based Systems", Polymers Paint Colour Journal, 1989, pp. 321-328, vol. 179, No. 4237.
Yoshimura, Technology on Adhesion and Sealing, 1985, pp. 32-39, vol. 29, No. 12.
Yoshimura, Technology on Adhesion and Sealing, 1986, pp. 42-47, vol. 30, No. 5.
Yoshimura, Technology on Adhesion and Sealing, 1986, pp. 42-47, vol. 30, No. 7.
Office Action dated May 27, 2014 issued from the Japan Patent Office in Japanese Application No. 2011-029436 Partial English-language Translation.

* cited by examiner

*Primary Examiner* — Vu A Nguyen
(74) *Attorney, Agent, or Firm* — Sughrue Mion, PLLC

(57) ABSTRACT

Provided is a method of producing a curable composition for imprints including (A) a polymerizable monomer, (B) a polymerization initiator, and (C) a solvent which is capable of effectively suppressing lifting or separation of patterns, excellent in coatability, and excellent in time-dependent stability. The method of producing a curable composition for imprints comprises preparing one species of liquid (D) which contains at least either one of the polymerizable monomer (A) and the polymerization initiator (B), passing the liquid (D) through a filter, and then adding the solvent (C).

19 Claims, No Drawings

METHOD FOR PRODUCING CURABLE COMPOSITION FOR IMPRINTS

CROSS-REFERENCE TO RELATED APPLICATIONS

The present application claims the benefit of priority from Japanese Patent Application No. 029436/2011, filed on Feb. 15, 2011, the contents of which are herein incorporated by reference in their entirety.

BACKGROUND OF THE INVENTION

1. Field of the Invention

The present invention relates to a curable composition for imprints, a method for producing a curable composition for imprints, a patterning method, and a device for producing a curable composition for imprints.

More precisely, the invention relates to a method for producing a curable composition for patterning through photo-irradiation to give imprints, which is used in producing magnetic recording media such as semiconductor integrated circuits, flat screens, micro electromechanical systems (MEMS), sensor devices, optical discs, high-density memory discs, etc.; optical members such as gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, etc.

2. Description of the Related Art

Nanoimprint technology is a development advanced from embossing technology well known in the art of optical disc production, which comprises pressing a mold original with an embossed pattern formed on its surface (this is generally referred to as "mold", "stamper" or "template") against a resin to thereby accurately transfer the micropattern onto the resin through mechanical deformation of the resin. In this, when a mold is once prepared, then microstructures such as nanostructures can be repeatedly molded, and therefore, this is economical, and in addition, harmful wastes and discharges from this nanotechnology are reduced. Accordingly these days, this is expected to be applicable to various technical fields.

Two methods of nanoimprint technology have been proposed; one is a thermal nanoimprint method using a thermoplastic resin as the material to be worked (for example, see S. Chou, et al., Appl. Phys. Lett. Vol. 67, 3114 (1995)), and the other is a photonanoimprint method using a photo-curable composition (for example, see M. Colbun, et al., Proc. SPIE, Vol. 3676, 379 (1999)). In the thermal nanoimprint method, a mold is pressed against a polymer resin heated up to a temperature not lower than the glass transition temperature thereof, then the resin is cooled and thereafter released from the mold to thereby transfer the microstructure of the mold onto the resin on a substrate. The method is applicable to various resin materials and glass materials and is expected to be applicable to various fields. For example, U.S. Pat. Nos. 5,772,905 and 5,956,216 disclose a nanoimprint method of forming nanopatterns inexpensively.

On the other hand, in the photonanoimprint method where a curable composition for photonanoimprints is photo-cured by photo-irradiation through a transparent mold or a transparent substrate, the transferring material does not require heating in pressing it against the mold, and therefore the method enables room-temperature imprinting. Recently, new developments having the advantages of the above two as combined, have been reported, including a nanocasting method and a reversal imprint method for forming three-dimensional structures.

For the nanoimprint methods as above, proposed are applied technologies mentioned below.

In the first technology, the molded pattern itself has a function, and is applied to various elements in nanotechnology and to structural members. Its examples include various micro/nano optical elements and high-density recording media, as well as structural members in optical films, flat panel displays, etc.

The second technology is for hybrid-molding of microstructures and nanostructures, or for construction of laminate structures through simple interlayer positioning, and this is applied to production of μ-TAS (micro-total analysis system) and biochips.

In the third technology, the formed pattern is used as a mask and is applied to a method of processing a substrate through etching or the like. In these technologies, high-precision positioning is combined with high-density integration; and in place of conventional lithography technology, these technologies are being applied to production of high-density semiconductor integrated circuits and transistors in liquid-crystal displays, and also to magnetic processing for next-generation hard discs referred to as patterned media. Recently, the action on industrialization of the above-mentioned nanoimprint technologies and their applied technologies has become active for practical use thereof.

As one example of nanoimprint technology, hereinunder described is an application to production of high-density semiconductor integrated circuits. The recent development in micropatterning and integration scale enlargement in semiconductor integrated circuits is remarkable, and high-definition photolithography for pattern transfer for realizing the intended micropatterning is being much promoted and advanced in the art. However, for further requirement for more definite micropatterning to a higher level, it is now difficult to satisfy all the three of micropattern resolution, cost reduction and throughput increase. Regarding this, as a technology of micropatterning capable of attaining at a low cost, nanoimprint lithography (photonanoimprint method) is proposed. For example, U.S. Pat. Nos. 5,772,905 and 5,259,926 disclose a nanoimprint technology of using a silicon wafer as a stamper for transferring a microstructure of at most 25 nm. This application requires micropatternability on a level of a few tens nm and high-level etching resistance of the micropattern functioning as a mask in substrate processing.

An application example of nanoimprint technology to production of next-generation hard disc drives (HDD) is described. Based on head performance improvement and media performance improvement closely connected with each other, the course of HDD history is for capacity increase and size reduction. From the viewpoint of media performance improvement, HDD has realized increased large-scale capacity as a result of the increase in the surface-recording density thereon. However, in increasing the recording density, there occurs a problem of so-called magnetic field expansion from the side surface of the magnetic head. The magnetic field expansion could not be reduced more than a certain level even though the size of the head is reduced, therefore causing a phenomenon of so-called sidelight. The sidelight, if any, may cause erroneous writing on the adjacent tracks and may erase the already recorded data. In addition, owing to the magnetic field expansion, there may occur another problem in that superfluous signals may be read from the adjacent track in reproduction. To solve these problems, there are proposed technologies of discrete track media and bit patterned media of filling the distance between the adjacent tracks with a non-magnetic material to thereby physically and magnetically separate the tracks. As a method of forming the magnetic or non-magnetic pattern in production of these media, application of nanoimprint technology is proposed. The application also requires micropatternability on a level of a few tens nm and high-level etching resistance of the micropattern functioning as a mask in substrate processing.

Next described is an application example of nanoimprint technology to flat displays such as liquid-crystal displays (LCD) and plasma display panels (PDP).

With the recent tendency toward large-sized LCD substrates and PDP substrates for high-definition microprocessing thereon, photonanoimprint lithography has become specifically noted these days as an inexpensive lithography technology capable of being substituted for conventional photolithography for use in production of thin-film transistors (TFT) and electrode plates. Accordingly, it has become necessary to develop a photo-curable resist capable of being substituted for the etching photoresist for use in conventional photolithography.

Further, for the structural members for LCD and others, application of photonanoimprint technology to transparent protective film materials described in JP-A-2005-197699 and 2005-301289, or to spacers described in JP-A-2005-301289 is being under investigation. Differing from the above-mentioned etching resist, the resist for such structural members finally remains in displays, and therefore, it may be referred to as "permanent resist" or "permanent film".

The spacer to define the cell gap in liquid-crystal displays is also a type of the permanent film; and in conventional photolithography, a photo-curable composition comprising a resin, a photopolymerizable monomer and an initiator has been generally widely used for it (for example, see JP-A-2004-240241). In general, the spacer is formed as follows: After a color filter is formed on a color filter substrate, or after a protective film for the color filter is formed, a photocurable composition is applied onto, and a pattern having a size of from 10 μm or 20 μm or so is formed through photolithography, and this is further thermally cured through past-baking to form the intended spacer.

Also an anti-reflective structure composed of a micro-pattern having a 50 to 300-nm pitch has been attracting public attention. Nanoimprint is useful also for forming the pattern. This sort of anti-reflective structure may be represented by a micro-dot pattern which is generally called "moth-eye", and is effective for improving anti-reflective performance of display surface, efficiency of solar energy utilization of solar cell, and light extraction efficiency of LED and organic EL device. Inmost cases of these applications, the thus-formed pattern remains in the final form of products, and is disposed in the outermost portion of the product, so that the anti-reflective structure is required to have excellent performance mainly regarding durability and strength of film, such as heat resistance, light resistance, solvent resistance, scratch resistance, good mechanical characteristics durable against external pressure, and hardness.

Further, nanoimprint lithography is useful also in formation of permanent films in optical members such as microelectromechanical systems (MEMS), sensor devices, gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, etc.

In application to such permanent films, the formed pattern remains in the final products, and is therefore required to have high-level properties of mainly film durability and strength, including heat resistance, light resistance, solvent resistance, scratch resistance, high-level mechanical resistance to external pressure, hardness, etc.

Almost all patterns heretofore formed in conventional photolithography can be formed in nanoimprint technology, which is therefore specifically noted as a technology capable of forming micropatterns inexpensively.

SUMMARY OF THE INVENTION

Now, the curable composition for imprints is required to be excellent in the patternability. Among various requirements for the patternability, it is strongly desired to suppress lifting or separation of patterns. For the case where the curable composition for imprint is coated on a substrate, it is also desired to avoid defects represented by non-uniform thickness of coated film, inclusion of particles in the coated film, and cissing of coating. In other words, good coatability is required. Additional investigations by the present inventors further revealed that these characteristics tend to degrade with elapse of time.

The present invention is directed to improve the problems in the prior art, and an object of which is to provide a method of producing a curable composition for imprints, which contains a solvent, capable of effectively suppressing lifting or separation of patterns, excellent in coatability, and excellent in time-dependent stability.

The present inventors found out from our investigations aimed at solving the above-described problems, that the curable composition for imprints may cause, in the process of production thereof, polymerization of polymerizable monomers contained therein as a major constituent, and thereby a polymer component may be produced. While the amount of the polymer component is very small, and is not detectable even by gel permeation chromatography (GPC), the minor polymer component was found to raise a large problem in the curable composition for imprints. More specifically, such trace amount of polymer component may form nuclei for particle growth, and may cause various problems. It was found that the minor polymer component of may induce coating defect during spin coating, or may induce lifting or separation of patterns due to contamination of foreign matters onto the substrate. While filtration is supposed to be effective for removing the minor polymer component, many of this sort of polymer components are dispersible or soluble into organic solvents. Accordingly, filtration of the solvent-containing curable composition for imprints does not solve the problems, since a part of the polymer component may pass through a filter. The present inventors found out that a polymer-component-free curable composition for imprints may be obtained, by preparing the curable composition for imprints after the components other than the solvent is filtered so as to remove the polymer component, and completed the present invention.

More specifically, the present inventors finally found out that the above-described problems may be solved by the means below:

[1] A method of producing a curable composition for imprints which includes (A) a polymerizable monomer, (B) a polymerization initiator, and (C) a solvent, which comprises preparing one species of liquid (D) which contains at least either one of the polymerizable monomer (A) and the polymerization initiator (B), passing the liquid (D) through a filter, and then adding the solvent (C); or comprises preparing two or more species of liquid (D) each of which contains at least either one of the polymerizable monomer (A) and the polymerization initiator (B), passing each of the liquids (D) through a filter, and then mixing the liquids (D) together with the solvent (C).

[2] The method of producing a curable composition for imprints according to [1], wherein the liquid (D) after passed through the filter is added with neither the polymerizable monomer (A) nor the polymerization initiator (B).

[3] The method of producing a curable composition for imprints according to [1] or [2], wherein at least one of the filters has a pore size of 0.1 μm or smaller.

[4] The method of producing a curable composition for imprints according to any one of [1] to [3], wherein at least one of the filters has an effective filtration area of 200 cm² or larger.

[5] The method of producing a curable composition for imprints according to any one of [1] to [4], wherein at least one of the filters is a filter cartridge formed by pleating a membrane filter.

[6] The method of producing a curable composition for imprints according to any one of [1] to [5], wherein the polymerizable monomer (A) is a polymerizable monomer having an aromatic structure and/or an alicyclic hydrocarbon structure.

[7] The method of producing a curable composition for imprints according to any one of [1] to [6], wherein the polymerizable monomer (A) contains a fluorine atom and/or a silicon atom:

[8] The method of producing a curable composition for imprints according to any one of [1] to [7], wherein the liquid (D) has a viscosity at 25° C. of 3 to 50 mPa·s.

[9] The method of producing a curable composition for imprints according to any one of [1] to [8], wherein the liquid (D) is filtered at least twice.

[10] The method of producing a curable composition for imprints according to any one of [1] to [9], which further comprises passing the curable composition obtained after addition of the solvent (C) through a filter.

[11] The method of producing a curable composition for imprints according to any one of [1] to [10], which comprises preparing one species of liquid (D), which contains at least either one of the polymerizable monomer (A) and the polymerization initiator (B), passing the liquid (D) through a filter, and then adding the solvent (C).

[12] The method of producing a curable composition for imprints according to any one of [1] to [11], which comprises preparing the liquid (D) by adding all components, other than the solvent (C), of the curable composition for imprints, passing the liquid (D) through the filter, and then adding the solvent (C) to the liquid (D).

[13] The method of producing a curable composition for imprints according to any one of [1] to [12], wherein all the filters have pore sizes of 0.1 μm or smaller.

[14] The method of producing a curable composition for imprints according to any one of [1] to [13], wherein at least one of the filters is a fluorine-containing resin based filter of a polyethylene based filter.

[15] The method of producing a curable composition for imprints according to any one of [1] to [14], wherein the polymerizable monomer (A) is a (meth)acrylate.

[16] The method of producing a curable composition for imprints according to any one of [1] to [15], wherein the curable composition for imprints includes both of a (meth)acrylate having an aromatic structure and/or an alicyclic hydrocarbon structure, and a (meth)acrylate containing a fluorine atom and/or a silicon atom as the polymerizable monomer (A).

[17] A method of forming a pattern, which comprises producing a curable composition for imprints according to any one of [1] to [16], applying the curable composition for imprints onto a base, pressing a mold against the curable composition for imprints, and irradiating light to the curable composition for imprints.

[18] The method of forming a pattern according to [17], wherein the curable composition for imprints is applied onto the base by coating.

[19] The method of forming a pattern according to [17], wherein the curable composition for imprints is applied onto the base by spin coating.

[20] A curable composition for imprints obtainable by the method of producing a curable composition for imprints according to any one of [1] to [16].

According to the present invention, the curable composition for imprints which contains a solvent, and is capable of effectively suppressing lifting or separation of patterns, excellent in coatability, and excellent in time-dependent stability, may be provided.

BEST MODE FOR CARRYING OUT THE INVENTION

The contents of the invention are described in detail hereinunder. In this description, the numerical range expressed by the wording "a number to another number" means the range that falls between the former number indicating the lowermost limit of the range and the latter number indicating the uppermost limit thereof.

In this description, "(meth)acrylate" means acrylate and methacrylate; "(meth)acrylic" means acrylic and methacrylic; "(meth)acryloyl" means acryloyl and methacryloyl. In the invention, monomer is differentiated from oligomer and polymer, and the monomer indicates a compound having a weight-average molecular weight of at most 1,000. In this description, "functional group" means a group participating in polymerization.

"Imprint" referred to in the invention is meant to indicate pattern transfer in a size of from 1 nm to 10 mm and preferably meant to indicate pattern transfer in a size of from about 10 nm to 100 μm (nanoimprint).

Regarding the expression of "group (atomic group)" in this description, the expression with no indication of "substituted" or "unsubstituted" includes both "substituted group" and "unsubstituted group". For example, "alkyl group" includes not only an alkyl group not having a substituent (unsubstituted alkyl group) but also an alkyl group having a substituent (substituted alkyl group).

The method of producing a curable composition for imprints according to the present invention is such as to prepare one species of liquid (D) which contains at least either one of the polymerizable monomer (A) and the polymerization initiator (B), allow the liquid (D) to pass through a filter, and then to add the solvent (C) to the liquid; or such as to prepare two or more species of liquid (D) each of which contains at least either one of the polymerizable monomer (A) and the polymerization initiator (B), allow each liquid (D) to pass through a filter, and then to mix them together with the solvent (C). By adopting the method like this, any polymer component contained as a minor impurity may appropriately be removed from the curable composition for imprints containing the solvent. In the present invention, it is preferable that neither the polymerizable monomer (A) nor the polymerization initiator (B) is added after the liquid (D) was passed through the filter. It is more preferable to prepare the liquid (D) by adding all components, other than the solvent (C), of the curable composition for imprints, allowing the liquid (D) to pass through the filter, and by adding only the solvent (C). For the case where the two or more species of liquid (D) are prepared, one possible method may be such as respectively allowing the two or more species of liquid (D) to pass through the filter, mixing the individual species of liquid (D), and then adding thereto the solvent (C); and another possible method may be such as adding the solvent (C) to one species of liquid (D), and adding thereto the residual species of liquid (D). The liquid (D) is preferably given as a single species.

By adopting the methods as described in the above, the impurity component may more effectively be removed, and thereby the effects of the present invention may more distinctively be expressed.

The effective filtration area for use in the present invention is 200 cm$^2$ or more. The effective filtration area is preferably 300 cm$^2$ or more, more preferably 500 cm$^2$ or more, further more preferably 1000 cm$^2$ or more.

The effective filter area of the present invention means an area of a part which is in contact with a liquid to be filtered and in which the particles which do not pass through a filter accumulate. The effective filter is generally a surface area of the filter.

In the method of the present invention, the curable composition is preferably passed through the filters at least twice. When the composition is passed through the filters at least twice, the filters may be the same or different to each other. By passing the composition through the filter at least twice, foreign substances are effectively removed.

The method for passing the curable composition for imprints through filters over multiple times is not specifically limited, but preferred is a method for circulating the composition in a device having a filter, a method for passing the composition at least one time through each of multiple filters which are placed in series, a method for re-filtering the composition after a filtration using the same or different filter from the filter of the former filtration, and a method for combining thereof.

When the composition is passed through the filters at least twice, the filter which the composition is passed through later preferably has a smaller pore size than a pore size of the filter in the former filtration. Such a constitution tends to effectively suppress the pattern-peeling.

The pressure applied to the composition in passing the composition through the filter may vary depending on materials of the filter, the filtering device, chemical structure of the curable composition, and is preferably 0.5 MPa. Such a pressure range effectively prevents from passing the particles due to impurity through the filter.

The pressure applied to the composition is preferably 0.05 MPa to 0.3 MPa, more preferably 0.05 MPa to 0.1 MPa. In the invention, an average flow rate of the curable composition for imprints is preferably 0.1 L per minute, more preferably 0.1 L per minute to 3.0 L per minute.

At least one filter of the filters for use in the present invention preferably has a pore size of 0.1 μm or more, and all of the filters each have a pore size of 0.1 μm or more. The pore size is preferably 0.05 μm or less, more preferably 0.005 to 0.05 μm. By passing the curable composition through a filter having the above pore size, microparticles having a submicron size and foreign substances may be removed.

Materials of the filter for use in the present invention is not specifically limited, but at least one kind of the materials is preferably a polypropylene resin, a fluorine resin, a polyethylene resin, or a nylon resin. Especially, at least one kind of the materials is a fluorine resin or a polyethylene resin from the viewpoints of the removal of the foreign substances and the stability over time of the filter.

The filter for use in the invention is preferably a filter cartridge in a pleat state fabricated from a membrane filter. Such a filter cartridge in a pleat state fabricated from a membrane filter has an advantage of large effective filter area.

In the present invention, it is more preferable to further allow the composition obtained after addition of the solvent (C) to pass through the filter. By additionally adopting the process like this, the effects of the present invention tends to more distinctively be expressed. The filtration process after the addition of the solvent (C) may preferably be proceeded similarly to the technique of filtering the liquid (D), with similar numerical limitations.

The device for manufacturing a curable composition for imprints of the present invention is not limited as long as the device contains the above filter. Concerning the other parts in the device, known techniques may be adapted. Specifically, the techniques disclosed in Japanese Patent No. 4323074 may be applied.

The curable composition for imprints of the present invention is characterized by comprising a polymerizable monomer (A) and a polymerizable initiator (B). The polymerizable monomer (A) is exemplified by a monomer having a polymerizable group, an oligomer having a polymerizable group, and a mixture thereof. For example, commercially available polymerizable monomers contain not only monomers having polymerizable groups, but also trace amounts of oligomers and polymers produced by polymerization of the monomers. The polymerizable monomer in the context of the present invention conceptually covers also these components.

Species of the polymerizable monomer adoptable to the curable composition for imprints used for the present invention is not specifically limited, without departing from the gist of the present invention, and may be exemplified by a polymerizable unsaturated monomer having at least one ethylenic unsaturated bond-containing group; epoxy compound; oxetane compound; vinyl ether compound; styrene derivative; fluorine atom-containing compound; and propenyl ether or butenyl ether.

The polymerizable unsaturated monomer having at least one ethylenic unsaturated bond-having group(s) is described below.

The polymerizable unsaturated monomer having one ethylenic unsaturated bond-having group includes concretely methyl(meth)acrylate, ethyl(meth)acrylate, butyl(meth)acrylate, N-vinyl pyrrolidinone, 2-acryloyloxyethyl phthalate, 2-acryloyloxy-2-hydroxyethyl phthalate, 2-acryloyloxyethyl hexahydrophthalate, 2-acryloyloxypropyl phthalate, 2-ethyl-2-butylpropanediol acrylate, 2-ethylhexyl(meth)acrylate, 2-ethylhexylcarbitol(meth)acrylate, 2-hydroxybutyl(meth)acrylate, 2-hydroxyethyl(meth)acrylate, 2-hydroxypropyl(meth)acrylate, 4-hydroxybutyl(meth)acrylate, acrylic acid dimer, benzyl(meth)acrylate, 1- or 2-naphthyl(meth)acrylate, butoxyethyl(meth)acrylate, cetyl(meth)acrylate, ethyleneoxide-modified (hereinafter this may be referred to as "EO") cresol(meth)acrylate, dipropylene glycol(meth)acrylate, ethoxylated phenyl(meth)acrylate, isoamyl(meth)acrylate, cyclopentanyl(meth)acrylate, isobornyl(meth)acrylate, dicyclopentanyl(meth)acrylate, dicyclopentanyloxyethyl(meth)acrylate, isomyristyl(meth)acrylate, lauryl(meth)acrylate, methoxydiproylene glycol(meth)acrylate, methoxytripropylene glycol(meth)acrylate, methoxypolyethylene glycol (meth)acrylate, methoxytriethylene glycol(meth)acrylate, neopentyl glycol benzoate(meth)acrylate, nonylphenoxypolyethylene glycol(meth)acrylate, nonylphenoxypolypropylene glycol(meth)acrylate, octyl(meth)acrylate, paracumylphenoxyethylene glycol(meth)acrylate, epichlorohydrin (hereinafter referred to as "ECH")-modified phenoxyacrylate, phenoxyethyl(meth)acrylate, phenoxydiethylene glycol(meth)acrylate, phenoxyhexaethylene glycol (meth)acrylate, phenoxytetraethylene glycol(meth)acrylate, polyethylene glycol(meth)acrylate, polyethylene glycol-polypropylene glycol(meth)acrylate, polypropylene glycol (meth)acrylate, stearyl(meth)acrylate, EO-modified succinic acid (meth)acrylate, tribromophenyl(meth)acrylate, EO-modified tribromophenyl(meth)acrylate, tridodecyl (meth)acrylate, p-isopropenylphenol, styrene, N-vinyl pyrrolidone, N-vinyl caprolactam.

Of the monofunctional polymerizable monomers having ethylenic unsaturated bond(s), monofunctional (meth)acrylate compound is preferably used in the present invention, from the viewpoint of photo-curability. The monofunctional (meth)acrylate compound may be exemplified by those previously exemplified as the monofunctional polymerizable monomers having ethylenic unsaturated bond(s).

Of those, especially preferred for use in the present invention are a mono-functional (meth)acrylate having an aromatic structure and/or alicyclic hydrocarbon structure in view of improving dry etching resistance, more preferably a mono-functional(meth)acrylate having an aromatic structure. Specific examples thereof include benzyl(meth)acrylate, benzyl (meth)acrylate having a substituent on the benzene ring, wherein examples of preferable substituent include an alkyl group having 1 to 6 carbon atoms, an alkoxy group having 1 to 6 carbon atoms, and cyano group, 1- or 2-naphthylmethyl (meth)acrylate, dicyclopentanyl(meth)acrylate, dicyclopentanyloxyethyl(meth)acrylate, isobornyl(meth)acrylate, adamantyl(meth)acrylate. More preferred examples thereof include benzyl(meth)acrylate having a substituent on the benzene ring, and monofunctional(meth)acrylate compound having a naphthalene structure. Particularly preferred examples thereof include 1- or 2-naphthyl(meth)acrylate and 1- or 2-naphtylmethyl(meth)acrylate.

As the other polymerizable monomer, also preferred is a poly-functional polymerizable unsaturated monomer having two ethylenic unsaturated bond-containing groups.

Preferred examples of the di-functional polymerizable unsaturated monomer having two ethylenic unsaturated bond-containing groups for use in the present invention include diethylene glycol monoethyl ether(meth)acrylate, dimethylol-dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth) acrylate, allyloxy-polyethylene glycol acrylate, 1,9-nonanediol di(meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified hexahydrophthalic acid diacrylate, hydroxypivalic acid neopentyl glycol di(meth)acrylate, neopentyl glycol di(meth)acrylate, EO-modified neopentyl glycol diacrylate, propyleneoxide (hereinafter referred to as "PO")-modified neopentyl glycol diacrylate, caprolactone-modified hydroxypivalate neopentyl glycol, stearic acid-modified pentaerythritol di(meth) acrylate, ECH-modified phthalic acid di(meth)acrylate, poly (ethylene glycol-tetramethylene glycol) di(meth)acrylate, poly(propylene glycol-tetramethylene glycol) di(meth)acrylate, polyester (di) acrylate, polyethylene glycol di(meth) acrylate, polypropylene glycol di(meth)acrylate, ECH-modified propylene glycol di(meth)acrylate, silicone di(meth) acrylate, triethylene glycol di(meth)acrylate, tetraethylene glycol di(meth)acrylate, dimethyloltricyclodecane di(meth) acrylate, neopentyl glycol-modified trimethylolpropane di(meth)acrylate, tripropylene glycol di(meth)acrylate, EO-modified tripropylene glycol di(meth)acrylate, triglycerol di(meth)acrylate, dipropylene glycol di(meth)acrylate, divinylethylene-urea, divinylpropylene-urea, o-, m-, or p-Xylylene di(meth)acrylate, 1,3-adamantane diacrylate, norbornane dimethanol diacrylate.

Of those, especially preferred for use in the present invention are neopentyl glycol di(meth)acrylate, 1,9-nonanediol di(meth)acrylate, tripropylene glycol di(meth)acrylate, tetraethylene glycol di(meth)acrylate, hydroxypivalate neopentyl glycol di(meth)acrylate, polyethylene glycol di(meth)acrylate, o-, m-, or p-, benzene di(meth)acrylate, o-, m-, or p-xylylene di(meth)aclyate, etc.

Examples of the poly-functional polymerizable unsaturated monomer having at least three ethylenic unsaturated bond-having groups include ECH-modified glycerol tri (meth)acrylate, EO-modified glycerol tri(meth)acrylate, PO-modified glycerol tri(meth)acrylate, pentaerythritol triacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryloxyethyl)isocyanurate, dipentaerythritol hexa(meth)acrylate, caprolactone-modified dipentaerythritol hexa(meth)acrylate, dipentaerythritol hydroxy-penta(meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritol ethoxy-tetra(meth)acrylate, pentaerythritol tetra(meth)acrylate, etc.

Of those, especially preferred for use in the present invention are EO-modified glycerol tri(meth)acrylate, PO-modified glycerol tri(meth)acrylate, trimethylolpropane tri(meth) acrylate, EO-modified trimethylolpropane tri(meth)acrylate, PO-modified trimethylolpropane tri(meth)acrylate, dipentaerythritol hexa(meth)acrylate, pentaerythritol ethoxy-tetra (meth)acrylate, pentaerythritol tetra(meth)acrylate, etc.

Of the multi-functional polymerizable unsaturated monomers having two or more ethylenic unsaturated bonds, multi-functional (meth)acrylate is preferably used from the viewpoint of photo-curability. The multi-functional (meth) acrylate herein is a general term for the bifunctional (meth) acrylate and tri-functional or higher valency of (meth) acrylates. Specific examples of multi-functional (meth) acrylate includes those found among the above-exemplified multi-functional polymerizable unsaturated monomer having two ethylenic unsaturated bonds, and those found among the above-exemplified multi-functional polymerizable unsaturated monomers having three or more ethylenic unsaturated bonds.

The oxirane ring-having compound (epoxy compound) includes, for example, polyglycidyl esters of polybasic acids, polyglycidyl ethers of polyalcohols, polyglycidyl ethers of polyoxyalkylene glycols, polyglycidyl ethers of aromatic polyols, hydrogenated polyglycidyl ethers of aromatic polyols, urethane-polyepoxy compounds, epoxidated polybutadienes, etc. One or more of these compounds may be used either singly or as combined.

The oxirane ring-having compounds preferred for use in the present invention are exemplified by those disclosed at paragraph 0053 of JP-A 2009-73078.

Of those, especially preferred are bisphenol A diglycidyl ether, bisphenol F diglycidyl ether, hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylolpropane triglycidyl ether, neopentyl glycol diglycidyl ether, polyethylene glycol diglycidyl ether, polypropylene glycol diglycidyl ether.

Commercial products favorable for use herein as the glycidyl group-having compound are exemplified by those disclosed at paragraph 0055 of JP-A 2009-73078. One or more of these may be used either singly or as combined.

The production method for the oxirane ring-having compounds is not specifically defined. For example, the compounds may be produced with reference to publications of Lecture of Experimental Chemistry 20, 4th Ed., Organic Synthesis II, p. 213, ff. (Maruzen, 1992); The chemistry of heterocyclic compounds—Small Ring Heterocycles, Part 3, Oxiranes (edited by Alfred Hasfner, John & Wiley and Sons, An Interscience Publication, New York, 1985); Yoshimura, Adhesive, Vol. 29, No. 12, 32, 1985; Yoshimura, Adhesive, Vol. 30, No. 5, 42, 1986; Yoshimura, Adhesive, Vol. 30, No. 7, 42, 1986; JP-A-11-100378, Japanese Patents 2906245 and 2926262. As the polymerizable monomer for use in the present invention, vinyl ether compounds also may be in the composition.

Any known vinyl ether compounds are usable and are exemplified by those disclosed at paragraph 0057 of JP-A 2009-73078.

These vinyl ether compounds can be produced, for example, according to the method described in Stephen. C. Lapin, Polymers Paint Colour Journal, 179 (4237), 321 (1989), concretely through reaction of a polyalcohol or a polyphenol with acetylene, or through reaction of a polyalcohol or a polyphenol with a halogenoalkyl vinyl ether. One or more of these compounds may be used either singly or as combined.

As the other polymerizable monomer for use in the invention, styrene derivatives may also be employed. The styrene derivatives include, for example, styrene, p-methylstyrene, p-methoxystyrene, beta-methylstyrene, p-methyl-beta-methylstyrene, alpha-methylstyrene, p-methoxy-beta-methylstyrene, p-hydroxystyrene, etc.

The curable composition for imprints in the present invention may further contain a polymerizable oligomer and/or a polymerizable polymer which has a molecular weight higher than that the above polymerizable monomer has, in view of improving dry etching resistance, imprint suitability and curability. The polymerizable oligomer includes various acrylate oligomers such as polyester acrylates, urethane acrylates, polyether acrylates, epoxy acrylates. The amount of the oligomer ingredient to be added to the composition may be preferably from 0 to 30% by mass of the composition except the solvent therein, more preferably from 0 to 20% by mass, even more preferably from 0 to 10% by mass, most preferably from 0 to 5% by mass.

The polymer component preferably has a polymerizable functional group in the side chain thereof. Weight-average molecular weight of the polymer component is preferably 2,000 to 100,000, and more preferably 5,000 to 50,000, in view of compatibility with the polymerizable monomer. Amount of addition of the polymer component, with respect to portion of the composition excluding the solvent, is preferably 0 to 30% by mass, more preferably 0 to 20% by mass, further more preferably 0 to 10% by mass, and most preferably 2% by mass or less. Pattern formability may be improved by adjusting the content of polymer component having a molecular weight of 2,000 or larger to 30% by mass, with respect to the portion of the curable composition for imprints of the present invention excluding the solvent.

The curable composition of the present invention preferably comprises a polymerizable monomer having at least either one of fluorine atom and silicon atom. The polymerizable monomer having at least either one of fluorine atom and silicon atom is understood as a compound having at least one group having fluorine atom, silicon atom, or both of fluorine atom and silicon atom, and at least one polymerizable functional group. The polymerizable functional group is preferably methacryloyl group, or epoxy group. While the content of the polymerizable monomer, having at least either one of fluorine atom and silicon atom, in the curable composition for imprints of the present invention is not specifically restricted, it is preferably 0.1 to 20% by mass of the total polymerizable monomer, preferably 0.2 to 15% by mass, more preferably 0.5 to 10% by mass, and particularly preferably 0.5 to 5% by mass, in view of improving curability and reducing viscosity of composition.

(1) Polymerizable Compound Having Fluorine Atom

The fluorine atom-containing group owned by the fluorine atom-containing polymerizable monomer is preferably selected from fluoroalkyl group and fluoroalkyl ether group. The fluoroalkyl group is preferably a fluoroalkyl group having carbon atoms of 2 to 20, and a fluoroalkyl group having carbon atoms of 4 to 8.

Preferable examples of fluoroalkyl group include trifluoromethyl group, pentafluoroethyl group, heptafluoropropyl group, hexafluoroisopropyl group, nonafluorobutyl group, tridecafluorohexyl group, and heptadecafluorooctyl group.

The polymerizable compound having fluorine atom is preferably a polymerizable compound having trifluoromethyl group. By virtue of the trifluoromethyl group structure, the effects of the present invention may be expressed only with a small amount of addition (10% by mass or less, for example), so that compatibility with other components may be improved, line edge roughness after dry etching may be improved, and formability of repetitive pattern may be improved.

The fluoroalkyl ether group preferably has a trifluoromethyl group, similarly to the fluoroalkyl group, which may be exemplified by perfluoroethylenoxy group and perfluoropropyleneoxy group. Preferable examples are those having a fluoroalkyl ether unit having a trifluoromethyl group such as —(CF(CF$_3$)CF$_2$O)—, and/or those having a trifluoromethyl group at the terminal of the fluoroalkyl ether group.

The total number of fluorine atoms per one molecule, owned by the polymerizable monomer, having at least either one of fluorine atom and silicon atom, is preferably 6 to 60, more preferably 9 to 40, even more preferably 12 to 40, still more preferably 12 to 20.

The polymerizable monomer having at least either one of fluorine atom has a fluorine content, defined below, of 20 to 60%, more preferably 30 to 60%, and still more preferably 35 to 60%. By adjusting the fluorine content in the appropriate range, the curable composition may be improved in compatibility with other components, less causative of fouling on mold, improved in the line edge roughness after dry etching, and improved in the formability of repetitive pattern transfer. In this patent specification, the fluorine content is given by the equation below:

Fluorine content=[{(Number of fluorine atoms in polymerizable compound)×(atomic weight of fluorine atom)}/(molecular weight of polymerizable compound)]×100

As a preferable example of the fluorine atom-containing of polymerizable monomer, having at least either one of fluorine atom and silicon atom, a compound having a partial structure represented by formula (I) below may be exemplified. By adopting a compound having such partial structure, the curable composition having an excellent formability of pattern, even after repetitive pattern transfer, may be obtained, and stability over time of the composition may be improved.

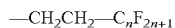

Formula (I)

In formula (I), n represents an integer of 1 to 8, and preferably 4 to 6.

One preferable example of the polymerizable monomer having fluorine atom is exemplified by a compound having a partial structure represented by the following formula (II). Of course, the polymerizable monomer having fluorine atom may have both of the partial structure represented by the following formula (I) and the partial structure represented by the following formula (II).

Formula (II)

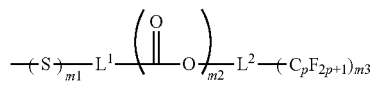

(In the formula (II), $L^1$ represents a single bond, or an alkylene group having carbon atoms of 1 to 8, $L^2$ represents an alkylene group having carbon atoms of 1 to 8, m1 and m2 each represent 0 or 1, wherein at least one of m1 and m2 is 1, m2 is an integer of 1 to 3, p is an integer of 1 to 8, and when m3 is 2 or more, each of $-C_pF_{2p+1}$ may be the same or different to each other.)

The above $L^1$ and $L^2$ each preferably are an alkylene group having carbon atoms of 1 to 4. The alkylene group may have a substituent without diverting the scope of the gist of the present invention. The above m3 is preferably 1 or 2. The above p is preferably an integer of 4 to 6.

As the fluorine atom-containing polymerizable monomer, exemplified are fluorine atom-containing monofunctional polymerizable monomer such as trifluoroethyl(meth)acrylate, pentafluoroethyl(meth)acrylate, (perfluorobutyl)ethyl (meth)acrylate, perfluorobutyl-hydroxypropyl(meth)acrylate, (perfluorohexyl)ethyl(meth)acrylate, octafluoropentyl (meth)acrylate, perfluorooctylethyl(meth)acrylate, tetrafluoropropyl(meth)acrylate, and hexafluoropropyl (meth)acrylate. Also multi-functional polymerizable monomer having two or more polymerizable functional groups, such as those having di(meth)acrylate structure having fluoroalkylene group, exemplified by 2,2,3,3,4,4-hexafluoropentane di(meth) acrylate and 2,2,3,3,4,4,5,5-octafluorohexane di(meth)acrylate, may be preferable examples of the fluorine atom-containing polymerizable monomer.

Also compounds having two or more fluorine-containing groups, such as fluoroalkyl group and fluoroalkyl ether group, in one molecule may preferably be used.

The compound having two of fluoroalkyl groups and/or fluoroalkyl ether groups in one molecule is preferably represented by the following formula (III);

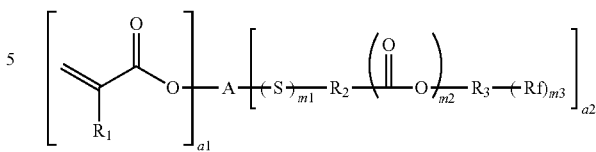

$R^1$ represents a hydrogen atom, an alkyl group, a halogen atom, or a cyano group, preferably a hydrogen atom, or an alkyl group, more preferably a hydrogen atom, or methyl group; A is a (a1+a2)-valent linking group, preferably a linking group having an alkylene group and/or an arylene group; which may have a linking group comprising a hetero atom. Examples of the linking group having a hetero atom include $-O-$, $-C(=O)O-$, $-S-$, $-C(=O)-$, $-NH-$. Those groups may have a substituent, but preferably a group not having a substituent. A preferably has 2 to 50 carbon atoms, more preferably represents 4 to 15.

a1 represents an integer of 1 to 6, preferably 1 to 3, and more preferably 1 or 2.

a2 represents an integer of 2 to 6, preferably 2 or 3, and more preferably 2.

$R^2$ and $R^3$ each represent a single bond or an alkylene group having a carbon atoms of 1 to 8. m1 and m2 each represent 0 or 1. m3 represents an integer of 1 to 3.

When a1 is 2, the individual (A)s may be same with, or different from each other.

When a2 is 2 or larger, each of $R^2$, $R^3$, m1, m2, m3, m4, m5 and n may be same with, or different from each other.

Rf represents a fluoroalkyl group or a fluoroalkyl ether group, preferably a fluoroalkyl group having carbon atoms of 1 to 8, and a fluoroalkyl ether group having carbon atoms of 3 to 20.

Specific examples of the polymerizable compound having fluorine atom used for the curable composition for imprints of the present invention will be given below, without restricting the present invention. $R^2$ in the formulae below represents any of hydrogen atom, alkyl group, halogen atom and cyano group.

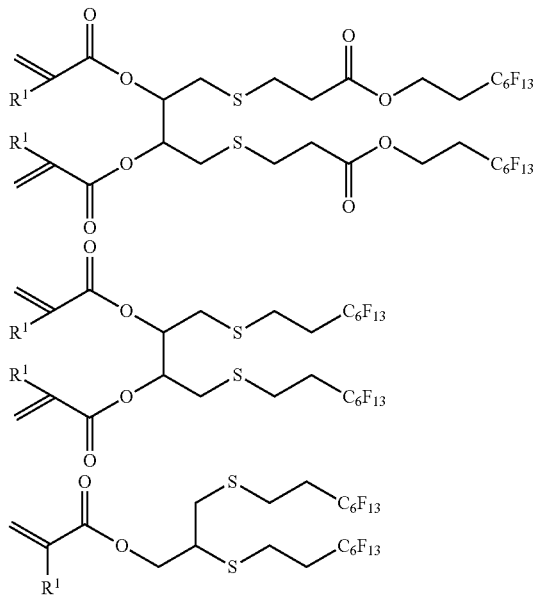

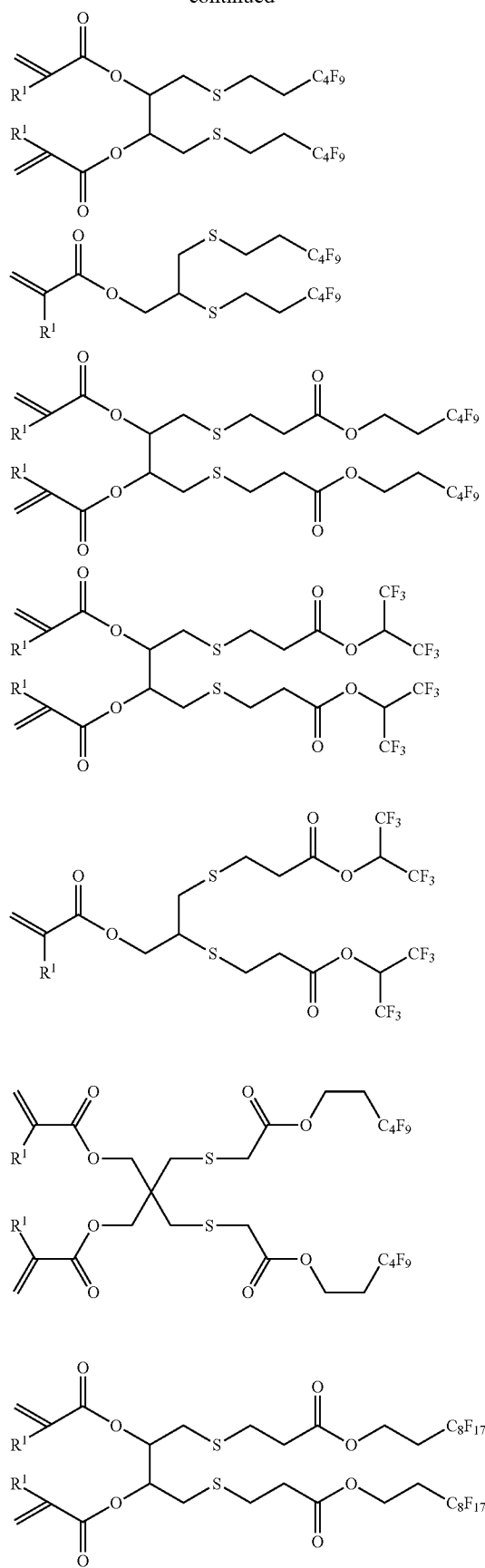
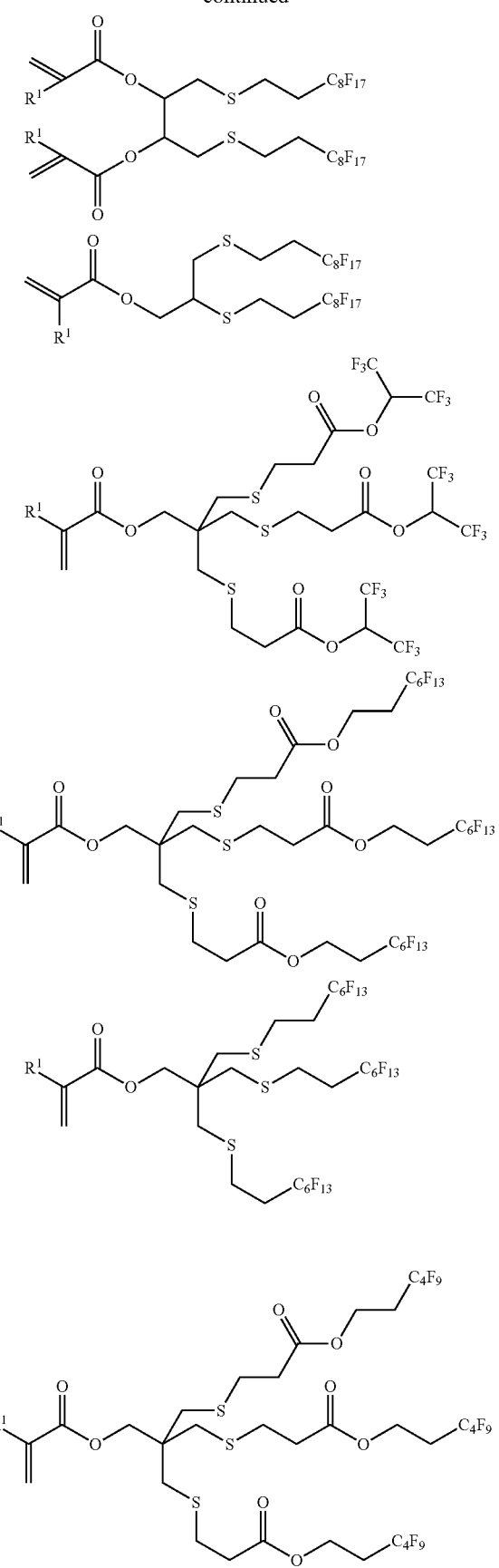

-continued

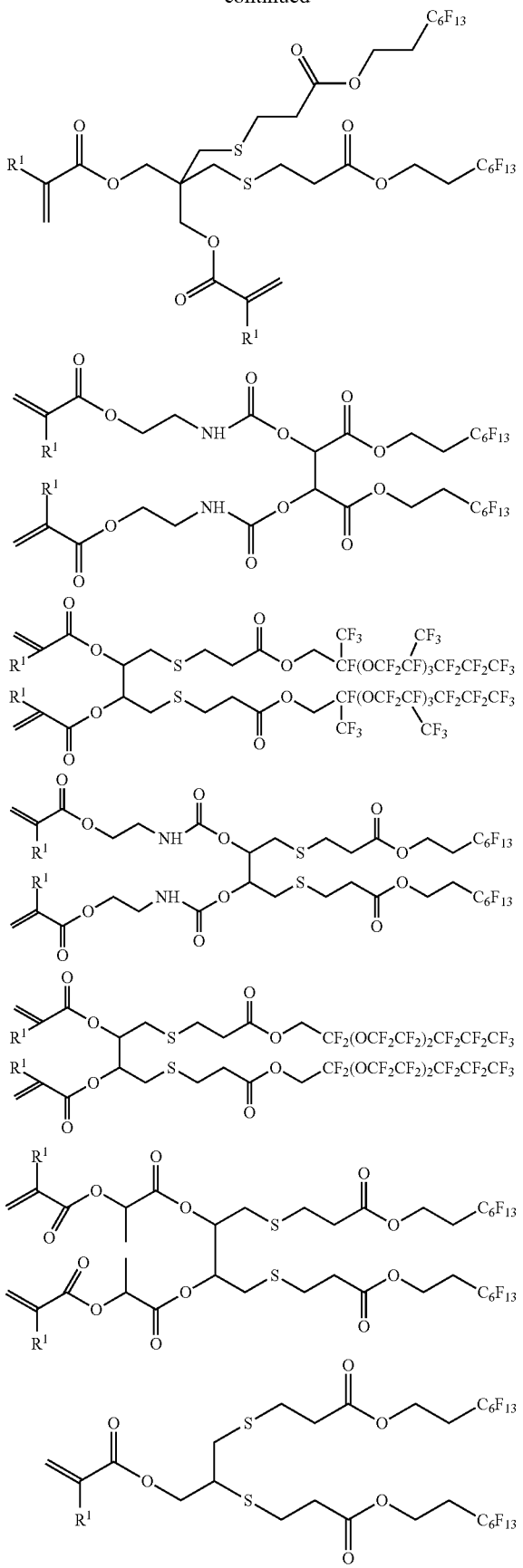

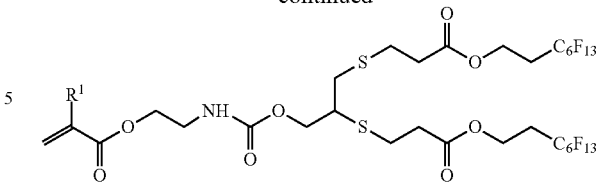

(2) Polymerizable Monomer Having Silicone Atom

A silicone-containing functional group that the above polymerizable monomer having silicone atom has is exemplified by a trialkyl silyl group, a trialkylsilyl group, a chain-like siloxane structure, a circular siloxane structure, and a cage-type siloxane structure. From the viewpoints of compatibility and mold releasability, it is preferable a trimethylsilyl group, or a functional group having a dimethylsiloxane structure.

The silicon atom-containing polymerizable monomer may be exemplified by 3-tris(trimethylsilyloxy)silylpropyl(meth) acrylate, trimethylsilylethyl(meth)acrylate, (meth)acryloyl-methylbis(trimethylsiloxy)methyl silane, (meth)acryloxymethyl tris(trimethylsiloxy)silane, 3-(meth)acryloxypropyl bis (trimethylsiloxy)methyl silane, a polysiloxane having a (meth)acryloyl group at a terminal or at a side chain which is exemplified by X-22-164 series, X-22-174DX, X-22-2426 and X-22-2475 manufactured by Shin-Etsu Chemical Co., Ltd.

As the other polymerizable monomer for use in the invention, propenyl ethers and butenyl ethers may also be employed. Preferred examples of the propenyl ethers and butenyl ethers include, for example, 1-dodecyl-1-propenyl ether, 1-dodecyl-1-butenyl ether, 1-butenoxymethyl-2-norbornene, 1,4-di(1-butenoxy)butane, 1,10-di(1-butenoxy) decane, 1,4-di(1-butenoxymethyl)cyclohexane, diethylene glycol di(1-butenyl)ether, 1,2,3-tri(1-butenoxy) propane, propenyl ether propylene carbonate, etc.

As the polymerizable monomer for use in the present invention, a polymerizable monomer represented by the following formula;

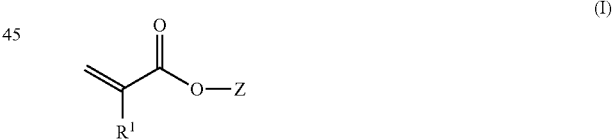

(In the formula, Z is a group having an aromatic group and having a molecular weight of 100 or more, R¹ is hydrogen atom, an alkyl group, or a halogen group. When the polymerizable monomer is liquid at 25° C., the viscosity thereof at 25° C. is 500 mPa·s or less.)

$R^1$ is preferably hydrogen atom, or an alkyl group, more preferably hydrogen atom, or a methyl group, furthermore preferably hydrogen atom from the viewpoint of the curability of the composition. Examples of the halogen atom include fluorine atom, chlorine atom, bromine atom, and iodine atom, and preferred is fluorine atom.

Z is an aralkyl group which may have a substituent, an aryl group which may have a substituent, or a group in which those groups are bonded to each other via a linking group. The linking group may include a hetero atom. The linking group is preferably —CH₂—, —O—, —C(=O)—, —S—, or a combination thereof. The aromatic group contained in Z is preferably a phenyl group or a naphthyl group, and the aromatic group more preferably contains only a phenyl group as an aromatic group. Compared with polycyclic aromatic groups and hetero aromatic groups, a compound containing only a phenyl group as an aromatic group has lower viscosity and better patternability, and can control failure of particle. The molecular weight of Z is preferably 100 to 300, more preferably 120 to 250.

From the viewpoints of the viscosity of the polymerizable monomer and the dry etching resistance, the number of the polymerizable groups and the number of the aromatic groups contained in a polymerizable monomer preferably satisfies as follows:
the number of the polymerizable groups is equal or small to the number of the aromatic groups In such a case, a condensed aromatic ring such as naphthalene is regarded as having one aromatic group, and two aromatic rings which bond to each other through a bond such as biphenyl is regarded as having two aromatic groups.

When the polymerizable monomer is liquid at 25° C., the viscosity thereof is preferably 2 to 500 mPa·s at 25° C., more preferably 3 to 200 mPa·s, further more preferably 3 to 100 mPa·s. The polymerizable monomer is preferably liquid at 25° C., or solid having a melting point of 60° C. or less, more preferably liquid at 25° C.

Z preferably represents —$Z^1$—$Z^2$. $Z^1$ is a single bond, or a hydrocarbon group which may have a linking group containing a hetero atom in the chain thereof. $Z^2$ is an aromatic group which may have a substituent. $Z^2$ has a molecular weight of 90 or more.

$Z^1$ is preferably a single bond, or an alkylene group which may have a linking group containing a hetero atom in the chain of the linking group.

$Z^1$ is more preferably an alkylene group not having a linking group containing a hetero atom in the chain thereof, more preferably a methylene group, or an ethylene group. Examples of the linking group containing a hetero atom include —O—, —C(=O)—, —S—, and a combination of an alkylene group and at least one of —O—, —C(=O)— and —S—. The number of the carbon atoms of Z is preferably 1 to 3.

$Z^2$ is an aromatic group having a substituent having a molecular weight of 15 or more. The aromatic group contained in $Z^2$ is exemplified by a phenyl group and a naphthyl group, preferably a phenyl group having a substituent having a molecular weight of 15 or more. $Z^2$ is preferably composed of an aromatic group having a single ring.

$Z^2$ is also preferably a group in which two or more aromatic groups directly bond to each other, or a group in which two or more aromatic groups bond to each other via a linking group. The linking group is preferably —$CH_2$—, —O—, —C(=O)—, —S—, or a combination thereof.

Examples of a substituent which the aromatic group may have include a halogen atom (fluorine atom, chlorine atom, bromo atom, iodine atom), a linear, a branched, or acyclic alkyl group, an alkenyl group, an alkynyl group, an aryl group, an acyl group, an alkoxycarbonyl group, an aryloxycarbonyl group, a carbamoyl group, a cyano group, a carboxyl group, a hydroxy group, an alkoxy group, an aryloxy group, an alkylthio group, an arylthio group, a heterocyclic-oxy group, an acyloxy group, an amino group, a nitro group, a hydrazino group, a heterocyclic group. A group which is substituted with those groups is also preferred.

The polymerizable monomer in the present invention is preferably in the form of liquid at 25° C. When the polymerizable monomer is in the form of liquid at 25° C., the viscosity at 25° C. is preferably 500 mPa·s, more preferably 300 mPa·s, further more preferably 100 mPa·s.

The amount of the compound represented by the formula to be added in the composition is preferably 10 to 100% by mass, more preferably 20 to 100% by mass, further more preferably 30 to 80% by mass.

The compound represented by the formula is also preferably represented by the following formula (II);

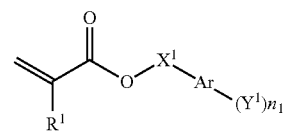

(II)

(In the formula (II), $R^1$ represents a hydrogen atom, an alkyl group, or a halogen atom; $X^1$ is a single bond, or a hydrocarbon group which may have a linking group containing a hetero atom in the chain of the linking group; $Y^1$ represents a substituent having a molecular weight of 15 or more; n1 represents an integer of 0 to 3, wherein n1 is 0, $X^1$ is a hydrocarbon group having carbon atoms of 2 or more; and Ar is an aromatic linking group, preferably a phenylene group, and an aromatic group.)

$R^1$ is the same as $R^1$ in the above formula (I) and the preferable range thereof is the same as $R^1$ in the above formula (I).

$X^1$ is the same as $Z^1$ in the above and the preferable range thereof is the same as $Z^1$ in the above.

$Y^1$ is a substituent having a molecular weight of 15 or more. Examples of $Y^1$ include an alkyl group, an alkoxy group, an aryloxy group, an alkenyl group, an aralkyl group, an acyl group, an alkoxycarbonyl group, an alkylthio group, an arylthio group, a halogen atom and a cyano group. Those substituents may have a substituent.

When n1 is 0, $X^1$ is preferably an alkylene group having carbon atoms of 2 or 3, and when n1 is 2, $X^1$ is preferably a single bond, or a hydrocarbon group having 1 carbon atom.

In particular, the more preferred embodiment is that n1 is 1 and $X^1$ is an alkylene group having 1 to 3 carbon atoms. The compound represented by the formula (II) is more preferably represented by the following formula (III);

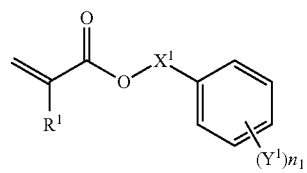

(III)

(In the formula (III), $R^1$ represents a hydrogen atom, an alkyl group, or a halogen atom; $X^1$ is a single bond, or a hydrocarbon group which may have a linking group containing a hetero atom in the chain of the linking group; $Y^1$ represents a substituent having a molecular weight of 15 or more; n1 represents an integer of 0 to 3. When n1 is 0, $X^1$ is a hydrocarbon group having 2 carbon atoms.)

$R^1$ is the same as $R^1$ in the above formula and the preferable range thereof is the same as $R^1$ in the above formula.

$X^1$ is the same as $Z^1$ in the above formula and the preferable range thereof is the same as $Z^1$ in the above formula.

$Y^1$ is the same as $Y^1$ in the above formula (II) and the preferable range thereof is the same as $Y^1$ in the above formula (II).

n1 is the same as n1 in the formula (II) and the preferable range thereof is the same as n1 in the formula (II).

The compound represented by the formula (III) is more preferably a compound represented by any one of the following formulae (IV) to (VI).
The compound represented by the formula (IV);

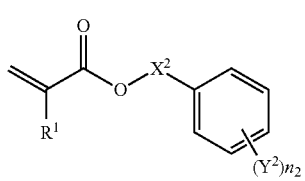

(IV)

(In the formula (IV), W represents a hydrogen atom, an alkyl group, or a halogen atom; $X^2$ is a single bond, or a hydrocarbon group which may have a linking group containing a hetero atom in the chain of the linking group; $Y^2$ represents a substituent having a molecular weight of 15 or more, the substituent being other than an aromatic group-containing group; n2 represents an integer of 0 to 3, wherein n2 is 0, $X^2$ is a hydrocarbon group having carbon atoms of 2 or 3.)

$R^1$ is the same as $R^1$ in the above formula and the preferable range thereof is the same as $R^1$ in the above formula.

When $X^2$ is a hydrocarbon group, $X^2$ is preferably a hydrocarbon having carbon atoms of 1 to 3, more preferably a hydrocarbon having a substituted or non-substituted alkylene group having carbon atoms of 1 to 3, further more preferably a non-substituted alkylene group having carbon atoms of 1 to 3, even more preferably ethylene group. Adoption of such a hydrocarbon group makes it possible to provide a photocurable composition having lower viscosity and low volatile.

$Y^2$ represents a substituent which has a molecular weight of 15 or more and the substituent is not an aromatic group-containing group. The upper limit of the molecular weight of $Y^2$ is preferably 80 or less. Examples of $Y^2$ include an alkyl group having 1 to 6 carbon atoms such as methyl group, ethyl group, isopropyl group, pert-butyl group, and cyclohexyl group, a halogen atom such as chlorine atom and bromo atom, and an alkoxy group having 1 to 6 carbon atoms such as methoxy group, ethoxy group, and cyclohexyloxy group.

n2 is preferably an integer of 0 to 2. When n2 is 1, the substituent $Y^2$ is preferably at para-position in the compound. When n2 is 2, $X^2$ is preferably a single bond, or a hydrocarbon group having one carbon atom from the viewpoints of the viscosity of the composition.

The composition represented by the formula (IV) is preferably a mono-functional (meth)acrylate having one (meth)acrylate group.

The molecular weight of the (meth)acrylate represented by the formula (IV) is preferably 175 to 250, more preferably 185 to 245 from the viewpoint of attainment of the low viscosity and the low volatility.

The viscosity at 25° C. of the (meth)acrylate represented by the formula (IV) is preferably 10 mPa·s or less, more preferably 6 mPa·s or less.

In addition, the compound represented by the formula (IV) preferably is used for a reaction diluent.
The amount of the compound represented by the formula (IV) to be added is preferably 10% by mass or more, more preferably 15% by mass or more, further more preferably 20% by mass or more from the viewpoint of the viscosity of the composition and the pattern accuracy of the cured film. While the amount thereof to be added is preferably 95% by mass or less, more preferably 90% by mass or less, further more preferably 85% by mass or less from the viewpoint of the tackiness of the cured film and the mechanical strength of the cured film.

Specific examples of the compounds represented by Formula (IV) are shown below, to which, however, the present invention should not be limited. $R^1$ in the formulae below represents any of hydrogen atom, methyl group, and halogen atom.

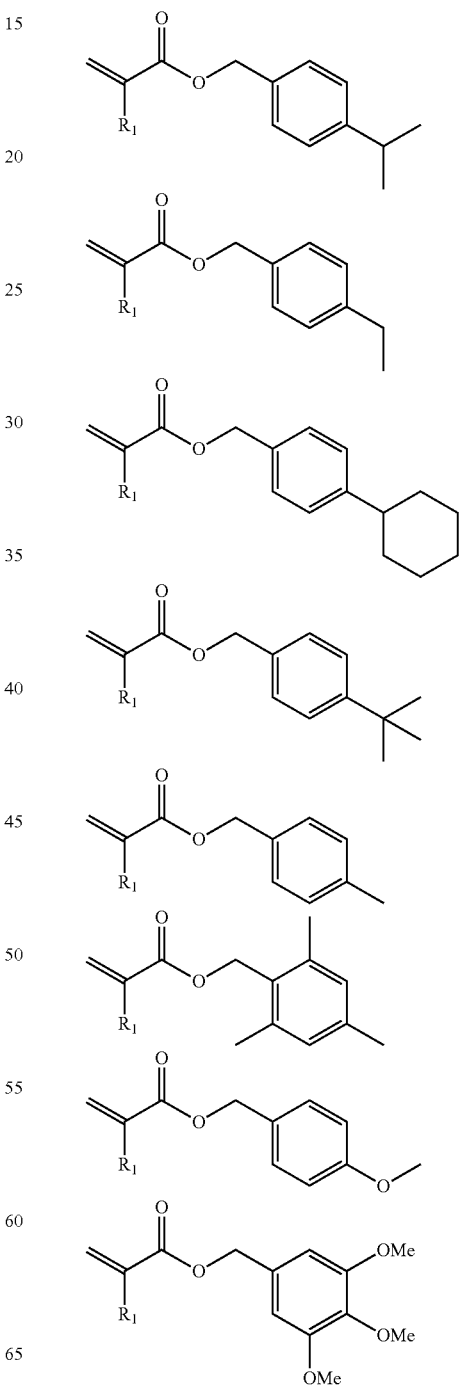

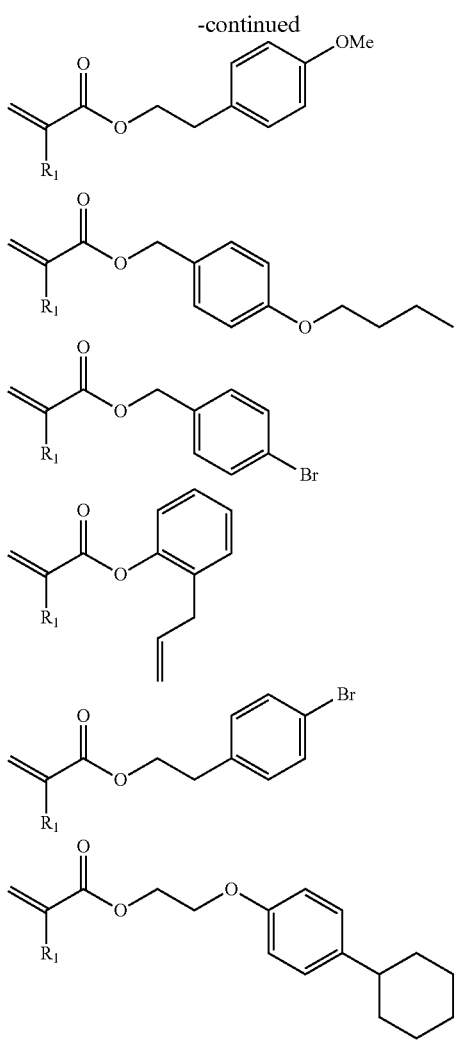

The compound represented by the formula (V);

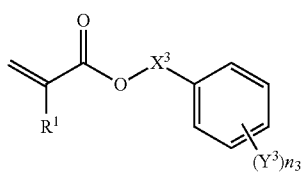

(V)

wherein $R^1$ represents a hydrogen atom, an alkyl group, or a halogen atom; $X^3$ is a single bond, or a hydrocarbon group which may have a linking group containing a hetero atom in the chain of the linking group; $Y^3$ represents a substituent having an aromatic group and having a molecular weight of 15 or more; and n3 represents an integer of 1 to 3.

$R^1$ is the same as $R^1$ in the above formula (I) and the preferable range thereof is the same as $R^1$ in the above formula (I).

$X^1$ is the same as $Z^1$ in the above formula and the preferable range thereof is the same as $Z^1$ in the above formula.

$Y^3$ represents a substituent having an aromatic group, and a preferred embodiment of the substituent having an aromatic group is the embodiment that an aromatic group bonds to the aromatic ring in the formula (V) directly, or via a linking group. Preferred example of the linking group thereof include an alkylene group, a linking group containing a hetero atom (preferably —O—, —S—, —C(=O)O—) and a combination thereof. Among them, an alkylene group, —O— and a combination thereof is more preferable. Embodiment in which a phenyl group bonds to the aromatic ring in the formula (V) directly, or via the above mentioned linking group is preferable. The substituent is preferably a phenyl group, a benzyl group, a phenoxy group, a benzyloxy group or a phenylthio group. The molecular weight of $Y^3$ is preferably 230 to 350.

n3 is preferably 1 or 2, more preferably 1.

The amount of the compound represented by the formula (V) to be added is preferably 10% by mass or more, more preferably 20% by mass or more, further more preferably 30% by mass or more. On the other hand, the amount thereof is preferably 90% by mass or less, more preferably 80% by mass or less, further more preferably 70% by mass, from the viewpoint of the tackiness and mechanical strength of the cured film.

Specific examples of the compounds represented by Formula (V) are shown below, to which, however, the present invention should not be limited. $R^1$ in the formulae below represents any of hydrogen atom, methyl group, and halogen atom.

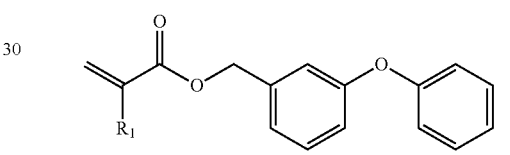

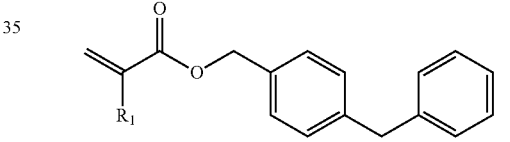

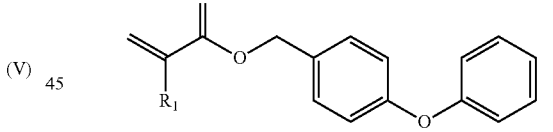

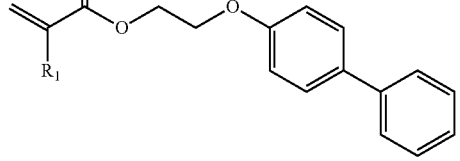

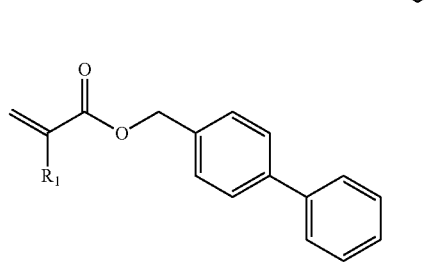

-continued

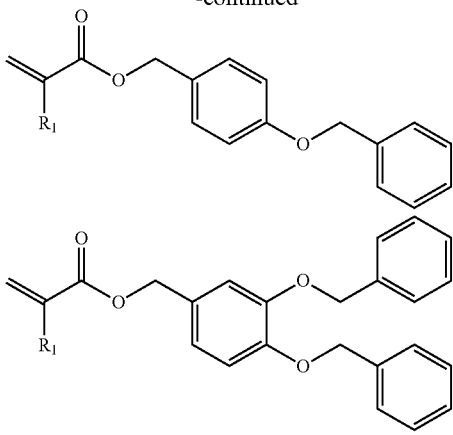

The compound represented by the formula (VI);

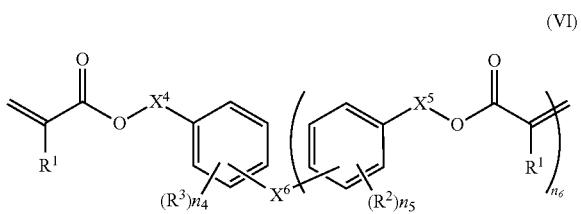

wherein $X^6$ is a (n6+1)-valent linking group; $R^1$ each are a hydrogen atom, an alkyl group, or a halogen atom; $R^2$ and $R^3$ each are a substituent; n4 and n5 each are an integer of 0 to 4; n6 is 1 or 2; and $X^4$ and $X^5$ each are a hydrocarbon group which may have a linking group containing a hetero atom in the chain of the linking group.

$X^6$ is a (n6+1)-valent linking group, preferably an alkylene group, —O—, —S—, —C(=O)O—, or a linking group consisting of a combination of two or more thereof. The alkylene group is preferably an alkylene group having 1 to 0.8 carbon atoms, more preferably an alkylene group having 1 to 3 carbon atoms. Also, the alkylene group is preferable an unsubstituted alkylene group.

n6 is preferably 1. When n6 is 2, the plural $R^1$, $X^5$ and $R^2$ existing in the formula may be the same or different.

$X^4$ and $X^5$ each are an alkylene group not having a linking group, more preferably an alkylene group having 1 to 5 carbon atoms, further more preferably an alkylene group having 1 to 3 carbon atoms, still more preferably a methylene group.

$R^1$ is the same as $R^1$ in the above formula and the preferable range thereof is the same as $R^1$ in the above formula.

$R^2$ and $R^3$ each represent a substituent, preferably an alkyl group, a halogen atom, an alkoxy group, an acyl group, an acyloxy group, an alkoxycarbonyl group, a cyano group, a nitro group. The alkyl group is preferably an alkyl group having 1 to 8 carbon atoms. The halogen atom is exemplified by fluorine atom, chlorine atom, bromine atom and iodine atom, and is preferably fluorine atom. The alkoxy group is preferably an alkoxy group having 1 to 8 carbon atoms. The acyl group is preferably an acyl group having 1 to 8 carbon atoms. The acyloxy group is preferably an acyloxy group having 1 to 8 carbon atoms. The alkoxycarbonyl group is preferably an alkoxycarbonyl group having 1 to 8 carbon atoms.

n4 and n5 each are an integer of 0 to 4. When n4 or n5 is two or more, the plural $R^2$ and $R^3$ existing in the formula may be the same or different.

The compound represented by the formula (VI) is preferably a compound represented by the formula (VII);

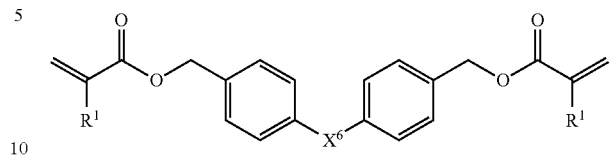

wherein $X^6$ represents an alkylene group, —O—, —S—, or a linking group which is combined with two or more thereof; $R^1$ each are a hydrogen atom, an alkyl group, or a halogen atom.

$R^1$ is the same as $R^1$ in the above formula (I) and the preferable range thereof is the same as $R^1$ in the above formula (I).

When $X^6$ is an alkylene group, the alkylene group is preferably an alkylene group having 1 to 8 carbon atoms, more preferably an alkylene group having 1 to 3 carbon atoms. The alkylene group is preferably an unsubstituted alkylene group.

$X^6$ is preferably —$CH_2$—, —$CH_2CH_2$—, —O—, or —S—.

The amount of the compound represented by the formula (VI) to be contained in the composition of the present invention is not defined. However, the content relative to the total amount of the polymerizable monomers is preferably 1 to 100% by mass, more preferably 5 to 70% by mass, further more preferably 10 to 50% by mass from the viewpoint of the curability and the viscosity of the composition.

Specific examples of the compounds represented by Formula (VI) are shown below, to which, however, the present invention should not be limited, wherein $R^1$ in the following is the same as $R^1$ in the above formula (VI), the preferable range thereof is the same as $R^1$ in the above formula (VI). The $R^1$ is more preferably a hydrogen atom.

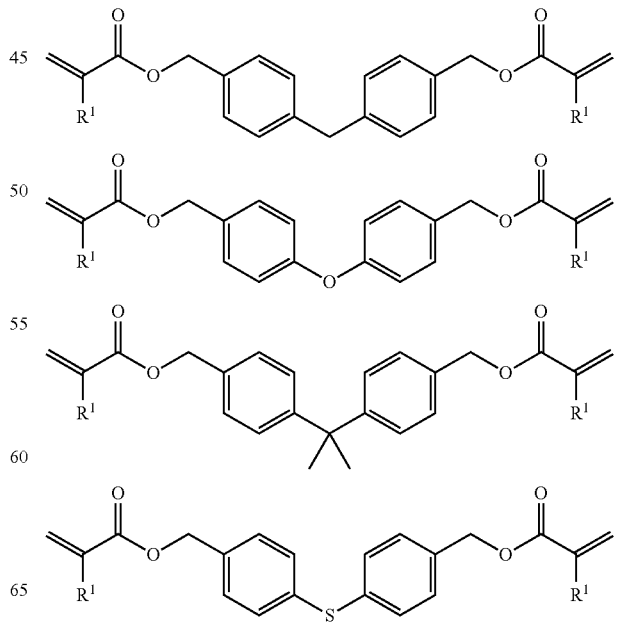

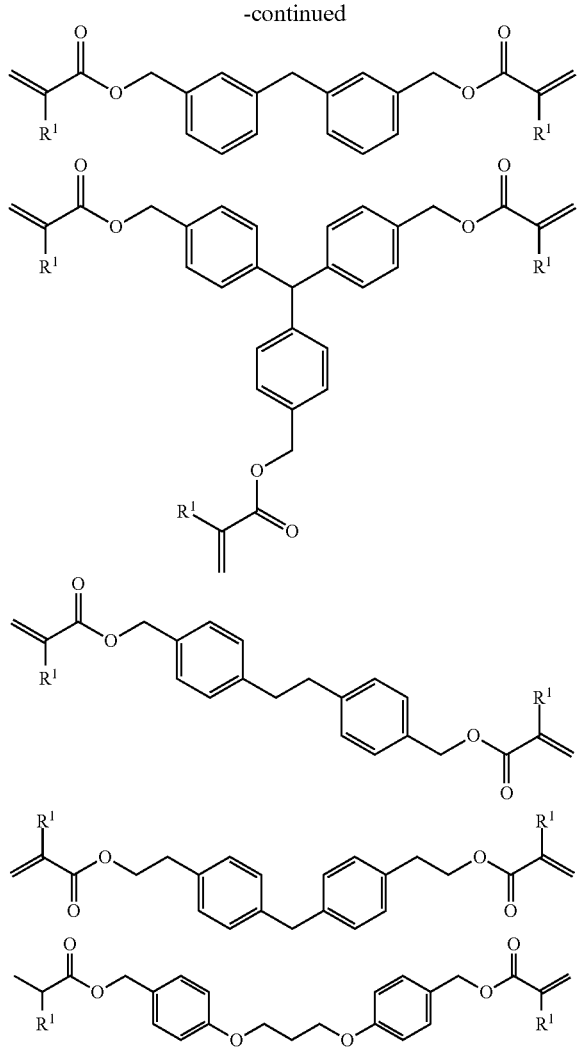

A polymerizable monomers for use in the invention is also exemplified by a polymerizable monomers represented by the following formula;

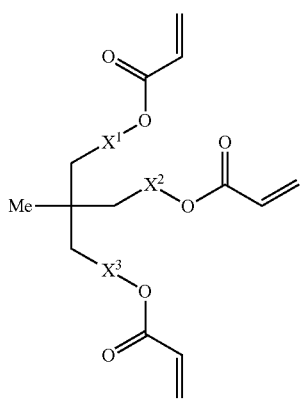

(In the formula, $X^1$ to $X^3$ each independently are a single bond, or a linking group. Me stands for methyl group)

When $X^1$ to $X^3$ is a linking group, it is preferably an organic linking group, which is preferably an organic group having carbon atoms of 1 to 50. Specific examples of the organic linking group include oxyalkylene group, —O—C(=O)—, alkylene group, and a group comprising at least two of those groups. The oxyalkylene group is exemplified by ethylene oxide group, or propylene oxide group. The alkylene group is exemplified by propylene group, butylene group, pentyl group, or hexyl group. $X^1$ to $X^3$ is preferably a single bond. The compound represented by the formula is preferably liquid at 25° C., but it may not be liquid.

Hereinunder, specific examples of the polymerizable monomers in the present invention are shown below.

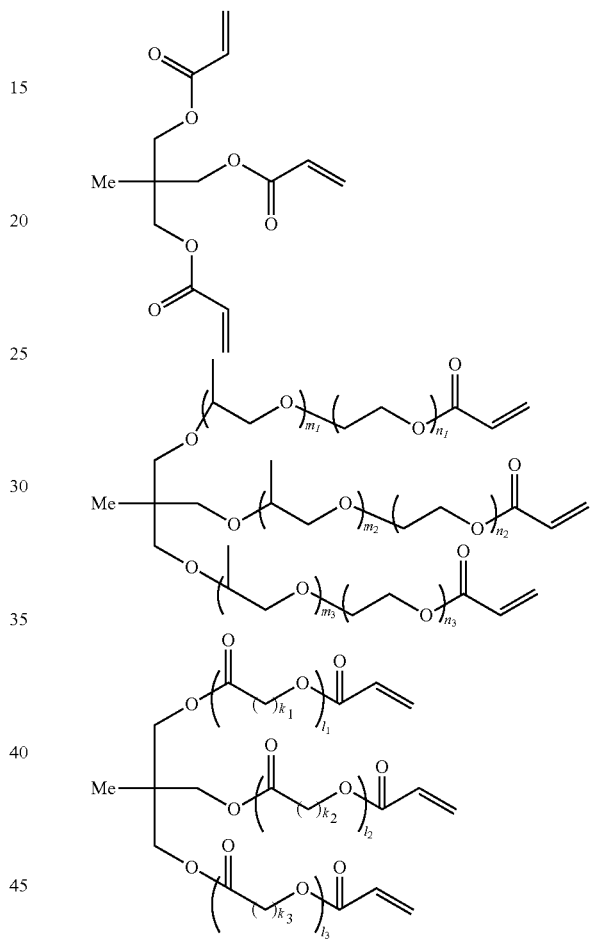

wherein $m^1$, $m^2$, $m^3$, $n^1$, $n^2$, $n^3$ n each are an integer of 0 to 10. The sum of $m^1$, $m^2$, $m^3$, $n^1$, $n^2$ and $n^3$ is more than 1, or a mixture of compounds in which the average of the sum of $m^1$, $m^2$, $m^3$, $n^1$, $n^2$ and $n^3$ is more than 1.

A polymerizable monomer for use in the invention is also exemplified by a polymerizable monomer represented by the following formula;

(I)

wherein Ar is an arylene group which may have a substituent, X is a single bond or an organic linking group, $R^1$ is hydrogen atom or methyl group, and n is 2 or 3.

In the formula, the above arylene group is exemplified by a hydrocarbon arylene group such as phenylene group and naphthylene group and a heteroarylene group which is a crosslinking group derived from indole or carbazole, and is preferably phenylene group from the viewpoints of the viscosity and the etching resistance. The above arylene group may have a substituent, and examples of the preferable substituent thereof include an alkyl group, an alkoxy group, hydroxy group, an alkoxycarbonyl group, an amide group, and a sulfone amide group.

The organic linking group in the above X is exemplified by an alkylene group, an arylene group and an aralkylene group which may include a hetero atom in the chain. Of those, preferred are an alkylene group and an arylene group, more preferred is an alkylene group. The above X is particularly preferably a single bond or an alkylene.

The above $R^1$ is hydrogen atom or methyl group, preferably hydrogen atom.

n is 2 or 3, preferably 2.

The above polymerizable monomer is preferably the following formula (I-a) or the following formula (I-b) from the viewpoint of reduction of the viscosity of the composition.

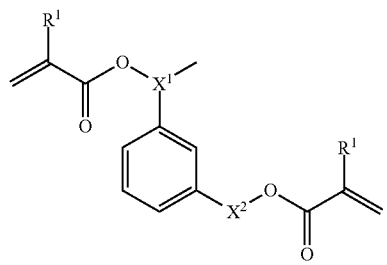

Formula (I-a)

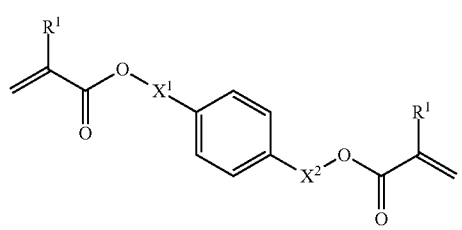

Formula (I-b)

wherein $X^1$ and $X^2$ each independently are a single bond or an alkylene group which may have a substituent having 1 to 3 carbon atoms, $R^1$ is hydrogen atom or methyl group.

In the formula (I-a), the above $X^1$ is preferably a single bond or methylene group, more preferably methylene group from the viewpoint of reduction of the viscosity.

The preferred range of the above $X^2$ is the same as the above $X^1$. The above $R^1$ is the same as $R^1$ in the above formula (VIII) and the preferred range is also the same.

The above polymerizable monomer is preferably liquid at 25° C. since liquid can control occurring foreign substance if the amount to be added thereof is increased.

Specific examples of the preferable polymerizable monomer are shown below. $R^1$ in the following monomer is the same as $R^1$ in the above formula, that is, $R^1$ is hydrogen atom or methyl group. The invention is not limited thereto.

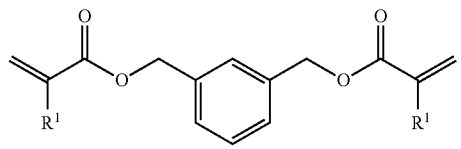

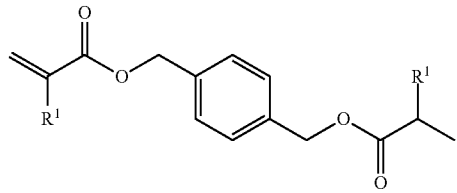

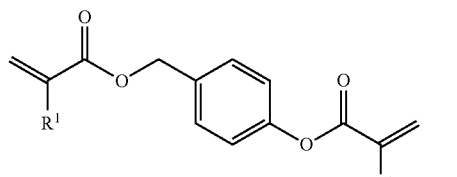

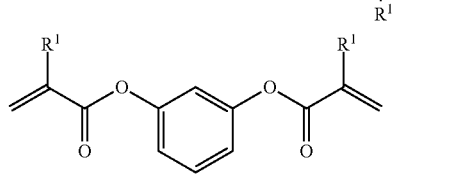

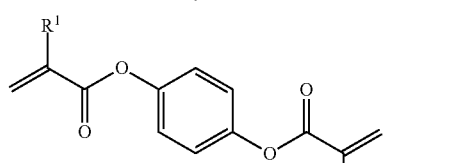

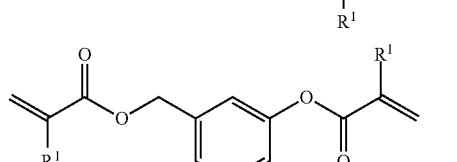

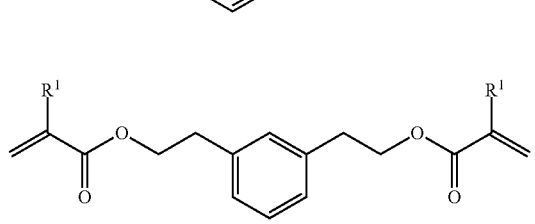

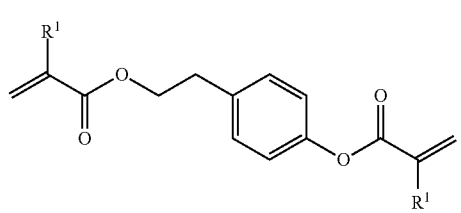

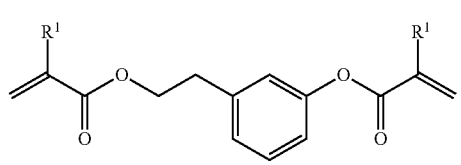

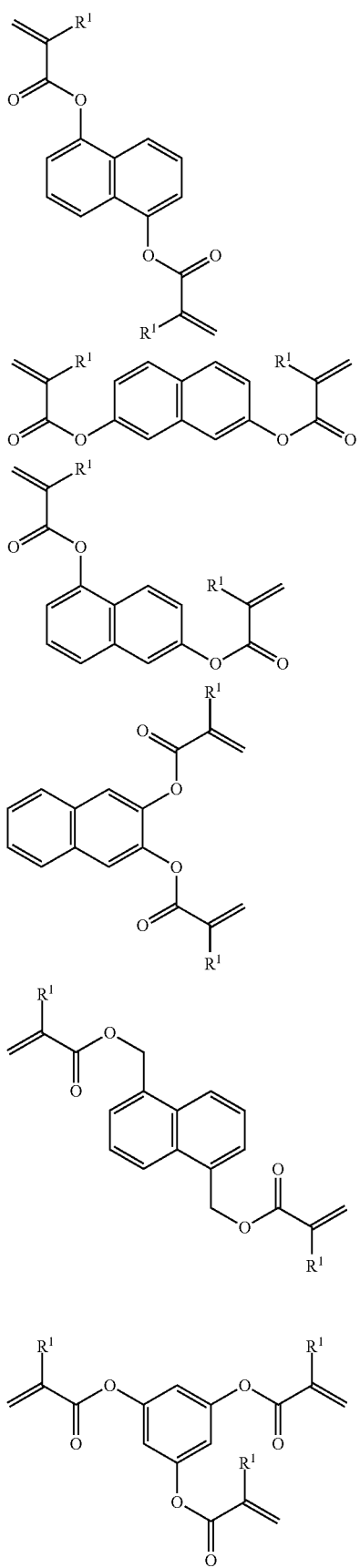

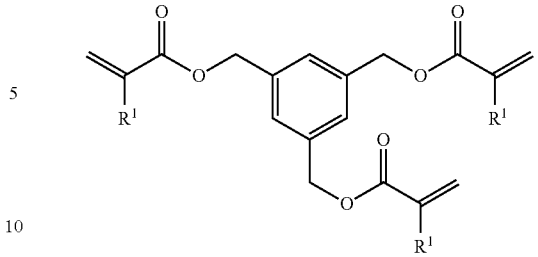

Among these polymerizable monomers, (meth)acrylate compound is preferable as the polymerizable monomer (A), from the viewpoints of viscosity of composition and photo-curability, and an acrylate is more preferable. In the present invention, a multi-functional polymerizable monomer having two or more polymerizable functional groups is preferable.

In the present invention, ratio of mixing of monofunctional (meth)acrylate compound and multi-functional (meth)acrylate compound is particularly preferably 80/20 to 0/100 on the weight basis, more preferably 70/30 to 0/100, and still more preferably 40/60 to 0/100. By selecting an appropriate ratio, the composition will have a sufficient level of curability; and low viscosity.

In the multi-functional (meth)acrylate compound, ratio of the bifunctional (meth)acrylate and the (meth)acrylate having three or higher degree of functionality is preferably 100/0 to 20/80 on the mass basis, more preferably 100/0 to 50/50, and still more preferably 100/0 to 70/30. Since the (meth)acrylate having three or higher degree of functionality has viscosity larger than that of the bifunctional (meth)acrylate, so that the curable composition for imprints of the present invention, having larger content of bifunctional (meth)acrylate, may be more preferable in view of reducing the viscosity.

The polymerizable monomer (A) component preferably contains a polymerizable monomer having an aromatic structure and/or alicyclic hydrocarbon structure, in view of improving dry etching resistivity. The polymerizable monomer (A) component preferably contains 50% by mass or more, and more preferably 80% by mass or more, of polymerizable monomer having an aromatic structure and/or alicyclic hydrocarbon structure. The polymerizable monomer having an aromatic structure is preferably a (meth)acrylate compound having an aromatic structure. Preferable examples of the polymerizable monomer having an alicyclic hydrocarbon structure include isoboronyl(meth)acrylate, dicyclopentanyl(meth)acrylate, dicyclopentanyl oxyethyl(meth)acrylate, dicyclopentenyl(meth)acrylate, adamantyl(meth)acrylate, tricyclodecanyl(meth)acrylate, and tetracyclododecanyl(meth)acrylate.

For the case where (meth)acrylate is used as the polymerizable monomer (A), acrylate is preferred over methacrylate.

Total content of the polymerizable monomer (A) in the curable composition for imprints of the present invention, excluding the solvent, is preferably 50 to 99.5% by mass, more preferably 70 to 99% by mass, and particularly preferably 90 to 99% by mass, in view of improving the curability, and improving viscosity of the curable composition for imprints of the present invention.

In the curable composition for imprints of the present invention, it is preferable that the content of polymerizable monomer having a viscosity at 25° C. of 3 to 100 mPa·s accounts for 80% by mass or more of the total polymerizable monomer (A) component, it is more preferable that the content of polymerizable monomer having a viscosity of 3 to 70 mPa·s accounts for 80% by mass or more, it is still more preferable that the content of polymerizable monomer having a viscosity of 7 to 50 mPa·s accounts for 80% by mass or more, and it is most preferable that the amount of polymerizable monomer having a viscosity of 8 to 30 mPa·s accounts for 80% by mass or more.

In the polymerizable monomer (A) contained in the curable composition for imprints of the present invention, the amount of a polymerizable monomer which exists in a form of liquid at 25° C. preferably is 50% by mass or more of the total polymerizable monomer, from the viewpoint of stability over time.

(B) Photo-Polymerization Initiator

The curable composition for imprints of the present invention contains a photo-polymerization initiator. The photo-polymerization initiator used in the present invention may be anything so far as it can generate, upon irradiation of light, an active species which promotes polymerization of the polymerizable monomer (A). The photo-polymerization initiator may be exemplified by cationic polymerization initiator and radical polymerization initiator, wherein the radical polymerization initiator is preferable. In the present invention, a plurality of species of photo-polymerization initiator may be used in combination.

Content of the photo-polymerization initiator used for the present invention, relative to the total composition excluding solvent, is typically 0.01 to 15% by mass, preferably 0.1 to 12% by mass, and still more preferably 0.2 to 7% by mass. For the case where two or more species of photo-polymerization initiators are used, the total amount is adjusted to the above-described ranges.

A content of photo-polymerization initiator of 0.01% by mass or above is preferable since the sensitivity (quick curability), resolution, line edge roughness, and film strength tend to improve. On the other hand, a content of photo-polymerization initiator of 15% by mass or less is preferable since the transmissivity of light, coloration and handlability tend to improve. In a system containing dye and/or pigment, they may occasionally act as a radical trapping agent, and may therefore adversely affect the photo-polymerization performance and sensitivity. Taking this point into consideration, the amount of addition of the photo-polymerization initiator is optimized for this sort of application. In contrast, dye and/or pigment are not essential components in the composition used for the present invention, so that the optimum range of the photo-polymerization initiator may be different from those of curable composition for ink jet process or curable composition for color filters of liquid crystal display devices.

Commercially available initiators may be adoptable to the radical photo-polymerization initiator in the present invention. Those described in paragraph [0091] in Japanese Laid-Open Patent Publication No. 2008-105414 may preferably be used. Among them, acetophenone-base compound, acylphosphine oxide-base compound, and oxime ester-base compound are preferable from the viewpoint of curing sensitivity and absorption characteristics.

The acetophenone-base compound may preferably be exemplified by hydroxyacetophenone-base compound, dialkoxyacetophenone-base compound, and aminoacetophenone-base compound. The hydroxyacetophenone-base compound may preferably be exemplified by Irgacure (registered trademark) 2959 (1-[4-(2-hydroxyethoxy)phenyl]-2-hydroxy-2-methyl-1-propane-1-one, Irgacure (registered trademark) 184 (1-hydroxycyclohexylphenylketone), Irgacure (registered trademark) 500 (1-hydroxycyclohexylphenylketone, benzophenone), Darocur (registered trademark) 1173 (2-hydroxy-2-methyl-1-phenyl-1-propane-1-one), all of which are available from Ciba Specialty Chemicals Inc.

The dialkoxyacetophenone-base compound may preferably be exemplified by Irgacure (registered trademark) 651 (2,2-dimethoxy-1,2-diphenylethane-1-one) available from Ciba Specialty Chemicals Inc.

The aminoacetophenone-base compound may preferably be exemplified by Irgacure (registered trademark) 369 (2-benzyl-2-dimethylamino-1-(4-morpholinophenyl) butanone-1), Irgacure (registered trademark) 379(EG) (2-dimethylamino-2-(4-methylbenzyl)-1-(4-morpholine-4-yl-phenyl) butane-1-one, and Irgacure (registered trademark) 907 (2-methyl-1-[4-methylthiophenyl]-2-morpholinopropane-1-one), all of which are available from Ciba Specialty Chemicals Inc.

The acylphosphine oxide-base compound may preferably be exemplified by Irgacure (registered trademark) 819 (bis(2,4,6-trimethylbenzoyl)-phenylphosphine oxide), and Irgacure (registered trademark) 1800 (bis(2,6-dimethoxybenzoyl)-2,4,4-trimethyl-pentylphosphine oxide), all of which are available from Ciba Specialty Chemicals Inc.; and Lucirin TPO (2,4,6-trimethylbenzoyldiphenylphosphine oxide), and Lucirin TPO-L (2,4,6-trimethylbenzoylphenylethoxyphosphine oxide), all of which are available from BASF.

The oxime ester-base compound may preferably be exemplified by Irgacure (registered trademark) OXE01 (1,2-octanedione,1-[4-(phenylthio)phenyl]-2-(O-benzoyloxime)), and Irgacure (registered trademark) OXE02 (ethanone, 1-[9-ethyl-6-(2-methylbenzoyl)-9H-carbazole-3-yl]-1-(O-acetyloxime)), all of which are available from Ciba Specialty Chemicals Inc.

The cation photo-polymerization initiator adoptable to the present invention is preferably sulfonium salt compound, iodonium salt compound, and oxime sulfonate compound, and may preferably be exemplified by 4-methylphenyl[4-(1-methylethyl)phenyliodonium tetrakis(pentafluorophenyl) borate (PI2074, from Rhodia), 4-methylphenyl[4-(2-methylpropyl)phenyliodonium hexafluorophophate (Irgacure 250, from Ciba Specialty Chemicals Inc.), Irgacure PAG103, 108, 121 and 203 (from Ciba Specialty Chemicals Inc.).

While it is necessary to appropriately select the photo-polymerization initiator adoptable to the present invention depending on wavelength of a light source to be employed, those not anticipated to produce gas during stamping with a mold, or during exposure of light may be preferable. Production of gas may result in fouling of the mold, frequent need of cleaning of the mold, and degradation of accuracy of transferred pattern due to deformation of the photo-curable composition in the mold.

The curable composition for imprints of the present invention is preferably a radical-polymerizable curable composition which contains a radical polymerizable monomer as the polymerizable monomer (A), and a radical polymerization initiator which generates a radical upon irradiation of light as the (B) photo-polymerization initiator.

While the liquid (D) in the present invention contains at least either one of the polymerizable monomer (A) and the polymerization initiator (B), it may additionally contain still other components. It is preferable for the liquid (D) in the present invention that 97% by weight or more of which, more preferably 99% by weight or more of which, is configured by the polymerizable monomer (A) and the polymerization initiator (B). Other components may be exemplified by publicly-known components to be added to the curable composition for imprints, such as surfactant and antioxidant. The components possibly be contained in the curable composition for imprints of the present invention will be described later. In the present invention, the liquid (D) preferably contains all components, other than the solvent, contained in the curable composition for imprints. Mixing and dissolution of the curable composition for imprints are generally proceeded in the temperature range from 0° C. to 100° C., and preferably 10° C. to 40° C.

The liquid (D) in the present invention preferably has a viscosity at 25° C. of 3 to 50 mPa·s, more preferably 3 to 40 mPa·s, still more preferably 3 to 30 mPa·s, and most preferably 3 to 20 mPa·s. The viscosity of smaller than 3 mPa·s may be causative of flow of the curable composition applied on the substrate, and may therefore fail in ensuring a sufficient level of thickness of the coated liquid, whereas the viscosity exceeding 50 mPa·s may make the filtration through small-pore filters difficult.

In particular, even if the polymerizable monomer (A) or the polymerization initiator (B) were not suitable for filtration in its original state, such as a tar or solid, mixing with the liquid (D) may make it filterable.

(C) Solvent

The curable composition for imprints in the present invention further contains the solvent (C). By virtue of the solvent contained in the curable composition for imprints of the present invention, the curable composition for imprints may be coated over the substrate.

The solvent in the context of the present invention is defined as a small molecule having a molecular weight of 500 or smaller, not polymerizable by the photo-polymerization initiator contained in the curable composition for imprints of the present invention. The solvent (C) adoptable to the present invention may be exemplified by ketones such as 2-butanone, 3-methylbutanone, pinacolone, 2-pentanone, 3-pentanone, 3-methyl-2-pentanone, acetone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, diisobutyl ketone, phenylacetone, methyl naphthyl ketone, acetylacetone, acetonylacetone, cyclopentanone, 2-methylcyclopentanone, 3-methylcyclopentanone, 2,2-dimethylcyclopentanone, 2,4,4-trimethylcyclopentanone, cyclohexanone, 3-methyl-cyclohexanone, 4-methyl-cyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, and isophorone; alkylene carbonates such as vinylene carbonate, ethylene carbonate, butylene carbonate, and propylene carbonate; esters such as methyl acetate, butyl acetate, ethyl acetate, isopropyl acetate, amyl acetate, propylene glycol monomethyl ether acetate, propylene glycol monoethyl ether acetate, propylene glycol monopropyl ether acetate, propylene glycol monobutyl ether acetate, ethylene glycol monoethyl ether acetate, ethylene glycol monomethyl ether acetate, diethylene glycol monobutyl ether acetate, diethylene glycol monoethyl ether acetate, 3-methoxybutyl acetate, 3-methyl-3-methoxybutyl acetate, propylene glycol monomethyl ether propionate, propylene glycol monoethyl ether propionate, methyl 3-methoxypropionate, methyl 3-ethoxypropionate, ethyl 3-methoxypropionate, ethyl 3-ethoxypropionate, methyl formate, ethyl formate, butyl formate, propyl formate, methyl lactate, ethyl lactate, propyl lactate, and butyl lactate; lactones such as β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone; alcohols such as methanol, ethanol, n-propanol, isopropanol, n-butanol, s-butanol, t-butanol, isobutanol, n-hexanol, n-heptanol, n-octanol, n-decanol, 4-methyl-2-pentanol, ethylene glycol, diethylene glycol, and triethylene glycol; ethers such as ethylene glycol monomethyl ether, propylene glycol monomethyl ether, ethylene glycol monoethyl ether, propylene glycol monoethyl ether, propylene glycol monopropyl ether, propylene glycol monobutyl ether, diethylene glycol monomethyl ether, dibutyl ether, diisopentyl ether, triethylene glycol monoethyl ether, methoxy methyl butanol, dioxane, tetrahydrofuran, and anisole; amides such as N-methyl-2-pyrrolidone, N,N-dimethylacetamide, N,N-dimethylformamide, hexamethylphosphoric triamide, and 1,3-dimethyl-2-imidazolidinone; aromatic hydrocarbons such as toluene and xylene; aliphatic hydrocarbons such as pentane, hexane, octane, decane, cyclopentane, and cyclohexane; water, and mixture of them.

The solvent may be added to the curable composition for imprints of the present invention, within the range not exceeding 99% by mass of the total composition, it may generally be added within the range from 20 to 99% by mass, preferably from 40 to 99% by mass, and particularly preferably from 70 to 98% by mass.

It is preferable for the curable composition for imprints in the present invention that 97% by mass of which is configured by the polymerizable monomer (A), the polymerization initiator (B) and the solvent (C).

The present invention further includes a method of producing a polymerizable monomer for imprints, which includes a process of removing a polymer impurity formed by polymerization of a part of the polymerizable monomer (A); a method of producing a curable composition for imprints which includes the method of producing the polymerizable monomer for imprints; and a curable composition for imprints, which contains the polymerizable monomer produced by the method of producing the polymerizable monomer for imprints.

The polymer impurity herein means a polymer possibly formed by polymerization of the polymerizable monomer (A), during production or storage of the polymerizable monomer (A), or during production or storage of the curable composition for imprints. For an exemplary case where two or more species of polymerizable monomer (A) are contained, the polymer impurity may contain not only homopolymers originated from the individual polymerizable monomers, but also copolymer originated from the two or more species of polymerizable monomer.

The present inventors found out from our investigations that is was difficult to detect an ultimately trace amount of polymer impurity by GPC, from the compositions which contain the polymerizable monomer (A) and the polymer impurity, such as those commercially available. It was also made clear that even such trace amount of polymer not detectable by GPC adversely affected imprinted patterns. From this point of view, the liquid (D) in the present invention preferably allows the polymerizable monomer (A) dissolved therein, and gives a turbidity of 1000 ppm or smaller, when added into a solvent which does not dissolve, or hardly dissolves, therein the polymer impurity so as to adjust the concentration of the liquid (D) to 10% by mass. The turbidity is more preferably 700 ppm or smaller, still more preferably 500 ppm or smaller, further more preferably 100 ppm or smaller, particularly preferably 10 ppm or smaller, and most preferably 1 ppm or smaller.

The solvent which does not dissolve, or hardly dissolves, therein the polymer impurity is preferably a solvent which contains a hydrocarbon solvent (for example, pentane, hexane, heptane, toluene, xylene and benzene), or an alcoholic solvent (for example, methanol, ethanol, 1- or 2-propanol, and 1- or 2-butanol).

The polymer impurity in the present invention means a component having a molecular weight larger than that of the polymerizable monomer (A), and also conceptually includes so-called oligomer. It means a component having a weight-average molecular weight of preferably 10,000 or larger, more preferably 30,000 or larger, and still more preferably 50,000 or larger. The composition may be degraded in the pattern transferability in imprinting, if the polymer impurity of particularly large molecular weight is contained.
(Other Ingredients)

In accordance with various objects, in addition to the above ingredient, the curable composition for imprints of the invention may contain any other ingredients such as surfactant, antioxidant and without impairing the effect of the invention.
—Surfactant—

Preferably, the curable composition for imprints of the invention contains a surfactant. The content of the surfactant in the composition except the solvent may be, for example, from 0.001 to 5% by mass of the composition, preferably from 0.002 to 4% by mass, more preferably from 0.005 to 3% by mass. In case where two or more different types of surfactants are in the composition, the total amount thereof falls within the above range. When the surfactant content in the composition falls from 0.001 to 5% by mass, it is favorable from the viewpoint of the coating uniformity, therefore hardly worsening the mold transferability owing to excessive surfactant.

As the surfactant, preferably, the composition contains at least one of a non-ionic surfactant, more preferably a fluorine-containing surfactant, a silicone-type surfactant, a fluorine-containing silicone-type surfactant, further more preferably contains both of a fluorine-containing surfactant and a silicone-type surfactant, or contains a fluorine-containing silicone-type surfactant, most preferably contains a fluorine-containing silicone-type surfactant. The fluorine-containing surfactant and the silicone-type surfactant are preferably non-ionic surfactants.

"Fluorine-containing silicone-type surfactant" as referred to herein means a surfactant satisfying both the requirement of a fluorine-containing surfactant and that of a silicone-type surfactant.

Using the surfactant of the type may solve the problem of coating failures such as striation and flaky pattern formation (drying unevenness of resist film) that may occur when the curable composition for imprints of the invention is applied onto substrates on which various films are formed, for example, onto silicon wafers in semiconductor production, or onto glass square substrates, chromium films, molybdenum films, molybdenum alloy films, tantalum films, tantalum alloy films, silicon nitride films, amorphous silicon films, tin oxide-doped indium oxide (ITO) films or tin oxide films in production of liquid-crystal devices. In addition, the surfactant is effective for enhancing the flowability of the composition of the invention in the cavity of a female mold, for enhancing the mold-resist releasability, for enhancing the resist adhesiveness to substrates, and for lowering the viscosity of the composition. In particular, when the above-mentioned surfactant is added to the composition for imprints of the invention, the coating uniformity of the composition can be greatly improved; and in coating with it using a spin coater or a slit scan coater, the composition ensures good coating aptitude irrespective of the size of the substrate to which it is applied.

Examples of the nonionic fluorine-containing surfactant usable in the invention include the surfactants disclosed at paragraph 0097 in JP-A-2008-105414.
—Antioxidant—

Preferably, the curable composition for imprints of the invention contains a known antioxidant. The content of the antioxidant to be in the composition is, for example, from 0.01 to 10% by mass of the total amount of the polymerizable monomers constituting the composition, preferably from 0.2 to 5% by mass. When two or more different types of antioxidants are in the composition, the total amount thereof falls within the above range.

The antioxidant is for preventing fading by heat or photo-irradiation, and for preventing fading by various gases such as ozone, active hydrogen NOx, SOx (x is an integer), etc. Especially in the invention, the antioxidant added to the composition brings about the advantage that the cured film is prevented from being discolored and the film thickness is prevented from being reduced through decomposition. The antioxidant includes hydrazides, hindered amine-type antioxidants, nitrogen-containing heterocyclic mercapto compounds, thioether-type antioxidants, hindered phenol-type antioxidants, ascorbic acids, zinc sulfate, thiocyanates, thiourea derivatives, saccharides, nitrites, sulfites, thiosulfates, hydroxylamine derivatives, etc. Of those, preferred are hindered phenol-type antioxidants and thioether-type antioxidants from the viewpoints of their effect of preventing cured film discoloration and preventing film thickness reduction.

Commercial products of the antioxidant usable herein include Irganox 1010, 1035, 1076, 1222 (all by Ciba-Geigy); Antigene P, 3C, FR, Sumilizer S, Sumilizer GA80 (by Sumitomo Chemical); Adekastab AO70, AO80, AO503 (by Adeka), etc. These may be used either singly or as combined.
—Polymerization Inhibitor—

Furthermore, the curable composition for imprints of the invention preferably comprises a polymerization inhibitor. The content of the polymerization inhibitor is from 0.001 to 1% by mass, more preferably from 0.005 to 0.5% by mass, and even more preferably from 0.008 to 0.05% by mass, relative to all the polymerizable monomers, and the change in the viscosities over time can be inhibited while maintaining a high curing sensitivity by blending the polymerization inhibitor in an appropriate amount. The polymerization inhibitor may be added at the production of the polymerizable monomer or may be added the curable composition after the production of the polymerizable monomer.

The polymerization inhibitor may be exemplified by hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), cerium (III) salt of N-nitrosophenyl hydroxylamine, phenothiazine, phenoxazine, 4-methoxynaphthol, 2,2,6,6-tetramethylpiperidine-1-oxyl, free radical, 2,2,6,6-tetramethylpiperidine, 4-hydroxy-2,2,6,6-tetramethylpiperidine-1-oxyl, free radical, nitrobenzene, and dimethylaniline; among which preferable examples include p-benzoquinone, 2,2,6,6-tetramethylpiperidine-1-oxyl, free radical, 4-hydroxy-2,2,6,6-tetramethylpiperidine-1-oxyl, free radical, and phenothiazine. The polymerization inhibitor suppresses production of the polymer impurity not only in the process of manufacturing the polymerizable monomer, but also during storage of the curable composition, and thereby suppresses degradation of pattern formability in the process of imprint.

In addition to the above-mentioned ingredients, the curable composition for imprints of the invention may contain, if desired, UV absorbent, light stabilizer, antiaging agent, plasticizer, adhesion promoter, thermal polymerization initiator, colorant, elastomer particles, photoacid enhancer, photobase generator, basic compound, flowability promoter, defoaming agent, dispersant, etc.

The curable composition for imprints of the invention may form a finer micropattern through photo-imprint lithography, at low cost and with high accuracy. Accordingly, the composition of the invention can form micropatterns heretofore formed according to conventional lithography at low cost and with high accuracy. For example, when the composition of the invention is applied onto a substrate and the composition layer is exposed to light, cured and exposed and cured, and dried if necessary, then permanent films of overcoat layers or insulating films for use in liquid-crystal displays (LCD) may be formed and the formed films may be used as an etching resist in producing semiconductor integrated circuits, recording materials or flat panel displays.

In permanent films (resists for structural members) for use in liquid-crystal displays (LCD) and in resists for use for substrate processing for electronic materials, the resist is preferably prevented from being contaminated as much as possible with metallic or organic ionic impurities in order that the resist does not interfere with the performance of the products. Accordingly, the concentration of the metallic or organic ionic impurities in the curable composition for imprints of the invention is preferably at most 1000 ppm, more preferably at most 10 ppm, even more preferably at most 100 ppb.

The patterning method (especially micropatterning method) of using the curable composition for imprints of the invention is described below. The patterning method of the invention comprises applying the curable composition for imprints of the invention onto a substrate or a support (base) to form a patterning layer thereon; pressing a mold against the surface of the patterning layer; and irradiating the patterning layer with light, thereby curing the composition of the invention to form a micropattern.

Preferably, the curable composition for imprints of the invention is, after irradiated with light, further heated and cured. Concretely, at least the composition of the invention is applied onto a substrate (base or support) and optionally dried to form, a layer comprising the composition of the invention (patterning layer), thereby preparing a pattern acceptor (having the patterning layer formed on the substrate), then a mold is pressed against the surface of the patterning layer of the pattern acceptor to thereby transfer the mold pattern onto the pattern acceptor, and the resulting micropatterned layer is cured through photo-irradiation. The photo-imprint lithography of the patterning method of the invention may enable lamination and multi-layer patterning, and therefore may be combined with ordinary imprint technology.

The patterning method (pattern transferring method) with the curable composition for imprints of the invention is described concretely hereinunder.

In the patterning method of the invention, the composition of the invention is first applied (preferably coated) onto a support to form a patterning layer thereon.

The coating method for applying the curable composition for imprints of the invention onto a substrate may be a well known coating method of, for example, a dip coating method, an air knife coating method, a curtain coating method, a wire bar coating method, a gravure coating method, an extrusion coating method, a spin coating method, a slit scanning method, an inkjet method, etc. Of those, the curable composition for imprints obtained by the production method of the present invention is suitable for coating, more suitable is a spin coating method.

The thickness of the patterning method of the composition of the invention may vary depending on the use thereof, and may be from 0.01 µm to 1 µm or so. The composition of the invention may be multiply coated. Between the substrate and the patterning method of the composition of the invention, any other organic layer may be formed, such as a planarizing layer, etc. With that, the patterning layer is not kept in direct contact with the substrate, and therefore, the substrate may be prevented from being contaminated with dust or from being scratched, and the adhesiveness of the patterning layer to the substrate may be enhanced. The pattern to be formed of the composition of the invention may have good adhesiveness to the organic layer, if any; formed on the substrate.

The substrate (base or support) to which the curable composition for imprints of the invention is applied may be selected from various materials depending on its use, including, for example, quartz, glass, optical film, ceramic material, vapor deposition film, magnetic film, reflective film, metal substrate of Ni, Cu, Cr, Fe or the like, paper, SOG (spin on glass), polymer substrate such as polyester film, polycarbonate film or polyimide film, TFT array substrate, PDP electrode plate, glass or transparent plastic substrate, electroconductive substrate of ITO, metal or the like, insulating substrate, semiconductor substrate such as silicon, silicon nitride, polysilicon, silicon oxide or amorphous silicon, which, however, are not limitative. The shape of the substrate is not also specifically defined. It may be tabular or roll. As described below, the substrate may be light-transmissive or non-light-transmissive, depending on the combination thereof with a mold.

Next, in the patterning method of the invention, a mold is pressed against the surface of the patterning layer for transferring the pattern from the mold onto the patterning layer. Accordingly, the micropattern previously formed on the pressing surface of the mold is transferred onto the patterning layer.

The mold material usable in the invention is described. IN the photo-imprint lithography with the composition of the invention, a light-transmissive material is selected for at least one of the mold material and/or the substrate. In the photo-imprint lithography applied to the invention, the curable composition for imprints of the invention is applied onto a substrate to form a patterning layer thereon, and a light-transmissive mold is pressed against the surface of the layer, then this is irradiated with light from the back of the mold and the patterning layer is thereby cured. Alternatively, the curable composition for photo-imprints is applied onto a light-transmissive substrate, then a mold is pressed against it, and this is irradiated with light from the back of the substrate whereby the curable composition for photo-imprints can be cured.

The photo-irradiation may be attained while the mold is kept in contact with the layer or after the mold is released. In the invention, preferably, the photo-irradiation is attained while the mold is kept in contact with the patterning layer.

The mold usable in the invention has a transferable pattern formed thereon. The pattern of the mold may be formed, for example, through photolithography, electronic beam lithography or the like by which a pattern may be formed to a desired processing accuracy. In the invention, however, the mold patterning method is not specifically defined.

Not specifically defined, the light-transmissive mold material for use in the invention may be any one having a desired strength and durability. Concretely, its examples include glass, quartz, light-transparent resin such as PMMA or polycarbonate resin, transparent metal deposition film, flexible film of polydimethylsiloxane or the like, photocured film, metal film, etc.

The non-light-transmissive mold to be used in the invention where a light-transmissive substrate is used is not also specifically defined and may be any one having a predetermined strength. Concretely, examples of the mold material include ceramic material, deposition film, magnetic film, reflective film, metal material of Ni, Cu, Cr, Fe or the like, as well as SiC, silicon, silicon nitride, polysilicon, silicon oxide, amorphous silicon, etc. However, these are not limitative. The shape of the mold is not also specifically defined, and may be any of a tabular mold or a roll mold. The roll mold is used especially when continuous transfer in patterning is desired.

The mold for use in the patterning method of the invention may be processed for surface release treatment for the purpose of enhancing the releasability of the curable composition for imprints of the invention from the mold. The mold of the type includes those surface-treated with a silicone-type or fluorine-containing silane coupling agent, for which, for example, commercial release agents such as Daikin's Optool DSX, Sumitomo 3M's Novec EGC-1720 and others are preferred.

In photo-imprint lithography with the composition of the invention, in general, the mold pressure in the patterning method of the invention is preferably at most 10 atmospheres. When the mold pressure is at most 10 atmospheres, then the mold and the substrate are hardly deformed and the patterning accuracy tends to increase. It is also favorable since the pressure unit may be small-sized since the pressure to be given to the mold may be low. The mold pressure is preferably selected from the region capable of securing the mold transfer uniformity, within a range within which the residual film of the curable composition for imprints in the area of mold pattern projections may be reduced.

In the patterning method of the invention, the dose of photo-irradiation in the step of irradiating the patterning layer with light may be sufficiently larger than the dose necessary for curing. The dose necessary for curing may be suitably determined depending on the degree of consumption of the unsaturated bonds in the curable composition for imprints and on the tackiness of the cured film as previously determined.

In the photo-imprint lithography applied to the invention, the substrate temperature in photo-irradiation may be room temperature; however, the photo-irradiation may be attained under heat for enhancing the reactivity. In the previous stage of photo-irradiation, preferably, the system is kept in vacuum as effective for preventing contamination with bubbles or contamination with oxygen or for preventing the reduction in reactivity, and as effective for enhancing the adhesiveness of the curable composition for imprints with mold. The system may be subjected to photo-irradiation while still kept in vacuum. In the patterning method of the invention, the vacuum degree in photo-irradiation is preferably from $10^{-1}$ Pa to ordinary pressure.

Light to be used for photo-irradiation to cure the curable composition for imprints of the invention is not specifically defined. For example, it includes light and irradiations with a wavelength falling within a range of high-energy ionizing radiation, near-ultraviolet, far-ultraviolet, visible, infrared, etc. The high-energy ionizing radiation source includes, for example, accelerators such as Cockcroft accelerator, Handegraf accelerator, linear accelerator, betatoron, cyclotron, etc. The electron beams accelerated by such an accelerator are used most conveniently and most economically; but also are any other radioisotopes and other radiations from nuclear reactors, such as grays, X rays, a rays, neutron beams, proton beams, etc. The UV sources include, for example, UV fluorescent lamp, low-pressure mercury lamp, high-pressure mercury lamp, ultra-high-pressure mercury lamp, xenon lamp, carbon arc lamp, solar lamp, etc. The radiations include microwaves, EUV, etc. In addition, laser rays for use in microprocessing of semiconductors, such as LED, semiconductor laser ray, 248 nm KrF excimer laser ray, 193 nm ArF excimer laser ray and others, are also favorably used in the invention. These lights may be monochromatic lights, or may also be lights of different wavelengths (mixed lights).

In photo-exposure, the light intensity is preferably within a range of from 1 mW/cm$^2$ to 50 mW/cm$^2$. When the light intensity is at least 1 mW/cm$^2$, then the producibility may increase since the photo-exposure time may be reduced; and when the light intensity is at most 50 mW/cm$^2$, then it is favorable since the properties of the permanent film formed may be prevented from being degraded owing to side reaction. Also preferably, the dose in photo-exposure is within a range of from 5 mJ/cm$^2$ to 1000 mJ/cm$^2$. When the dose is less than 5 mJ/cm$^2$, then the photo-exposure margin may be narrow and there may occur problems in that the photo-curing may be insufficient and the unreacted matter may adhere to mold. On the other hand, when the dose is more than 1000 mJ/cm$^2$, then the composition may decompose and the permanent film formed may be degraded.

Further, in photo-exposure, the oxygen concentration in the atmosphere may be controlled to be less than 100 mg/L by introducing an inert gas such as nitrogen or argon into the system for preventing the radical polymerization from being retarded by oxygen.

In the patterning method of the invention, after the pattern layer is cured through photo-irradiation, if desired, the cured pattern may be further cured under heat given thereto. The method may additionally includes the post-curing step. Thermal curing of the composition of the invention after photo-irradiation is preferably attained at 150 to 280° C., more preferably at 200 to 250° C. The heating time is preferably from 5 to 60 minutes, more preferably from 15 to 45 minutes.

[Pattern]

The pattern thus formed according to the patterning method of the invention as described in the above can be used as a permanent film (resist for structural members) for use in liquid-crystal displays (LCD) and others, or as an etching resist. After its production, the composition of the invention may be bottled in a container such as a gallon bottle or a coated bottle, and may be transported or stored. In this case, the container may be purged with an inert gas such as nitrogen, argon or the like for preventing the composition therein from being degraded. The composition may be transported or stored at ordinary temperature, but for preventing the permanent film from being degraded, it is preferably transported or stored at a controlled temperature of from −20° C. to 0° C. Needless-to-say, the composition is shielded from light to such a level on which its reaction does not go on.

The pattern formed by using the curable composition for imprints of the present invention is also excellent in solvent resistance. While it is preferable that the curable composition for imprints of the present invention is highly durable against a wide variety of solvents, it is particularly preferable that the curable composition does not cause variation in the film thickness typically when immersed in N-methylpyrrolidone, which is a solvent generally used in the process of manufacturing the substrate, at 25° C. for 10 minutes.

The pattern formed according to the patterning method of the invention is useful as an etching resist. In case where the composition for imprints of the invention is used as an etching resist, a nano-order micropattern is first formed on a substrate such as a silicon wafer with a thin film of SiO$_2$ or the like formed thereon, according to the patterning method of the invention. Next, this is etched with hydrogen fluoride in wet etching, or with $CF_4$ in dry etching, thereby forming a desired pattern on the substrate. The curable composition for imprints of the invention exhibits especially good etching resistance in dry etching.

EXAMPLES

The characteristics of the invention are described more concretely with reference to Production Examples and Examples given below. In the following Examples, the material used, its amount and the ratio, the details of the treatment and the treatment process may be suitably modified or changed not overstepping the scope of the invention. Accordingly, the invention should not be limitatively interpreted by the Examples mentioned below.

As the polymerizable monomer for use in the Example, the viscosity at 25° C. and the boiling point at 1 atom were shown in the following Table 1. The viscosity was measured at 25±0.2° C., using RE-80L-type relative viscosmeter manufactured by Toki Sangyo Co., Ltd. The unit was shown by mPa·s.

In the Example, the following materials were used.
(A1) Synthesis of polymerizable monomer, m-xylylene diacrylate To 1000 ml of distillated water, 411 g of sodium hydroxide was added, and 781 g of acrylic acid was dropwisely added to the solution under ice. To the mixture, 107 g of benzyl tributylammonium chloride and 600 g of α,α'-dichlorometaxylene were added, and the mixture was allowed to react at 85° C. for 7 hours. To the reaction solution, 1600 ml of ethyl acetate was added, the organic layer was then sequentially washed with a 1% aqueous hydrochloric acid solution, a 1% aqueous tetramethylammonium hydroxide solution and distilled water, the organic layer was condensed in vacuo so as to reduce the solvent content to 1% by mass or below, to thereby obtain a crude product (polymerizable monomer composition) which contains polymerizable monomer (A1). (A1) was found to show a viscosity at 25° C. of 9.5 mPa·s. (A1) was also found to show a boiling point at 1 atm of 300° C. or higher.
(A2) Synthesis of polymerizable monomer, 2-naphtylmethyl acrylate Under nitrogen stream, 600 g of 2-methyl naphthalene was dissolved with 6000 ml of ethyl acetate, 422 g of 1,3-dibromo-5,5,dimethyl hydantoin was added thereto, and was heated up to 40° C. To this, 7.4 g of V-65 manufactured by Wako Pure Chemical Industries, Ltd was added and reacted at 40° C. for 7 hours. The reaction solution was treated at 65° C. for 3 hours, and then, was cooled. After the reaction solution was washed with aqueous solution of sodium hydrogen carbonate and distilled water, the reaction solution was concentrated. To this, 3600 ml of isopropanol was added and stirred for 30 minutes, and then, 900 ml of distilled water was added and stirred for 30 minutes. The deposited solid was filtered and separated. To this, 1800 ml of isopropanol was added and stirred for 30 minutes, and then, 450 ml of distilled water was added and stirred for 30 minutes. The solid was filtered and separated, and dried to obtain 300 g of 2 bromomethyl naphthalene.

To 200 ml of distilled water, 81.4 g of sodium hydroxide was added, and 147 g of acrylic acid was dropped thereto under storage in ice. To this, 42.4 g of benzyl tributyl ammonium chloride and 300 g of 2-bromomethyl naphthalene were added and reacted at 75° C. for 2 hours. After the reaction, 800 ml of a mixture of ethyl acetate/hexyane=2/8 (volum ratio) was added thereto, the organic phase was washed with 1% of aqueous solution of acidum hydrochloricum, 1% of tetramethylammonium hydroxy aqueous solution, and distilled water. To the organic phase, 0.01 g of p-benzoquinone as a polymerizable inhibitor was added and concentrated under vacuum so that the content of the solvent in the organic phase is 1% by mass or less, to thereby obtain the polymerizable monomer (A2). The viscosity of (A2) was 10.3 mPa·s at 25° C.
(A3) The following compound

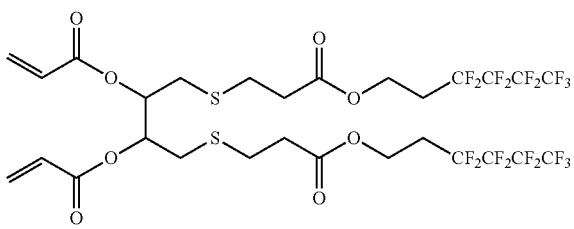

(A4) The following compound

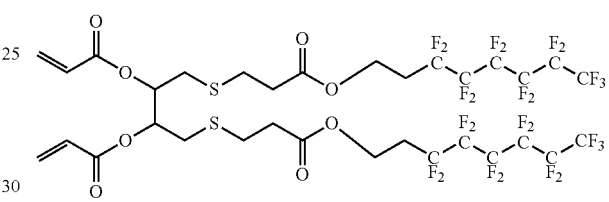

(A5) The following compound

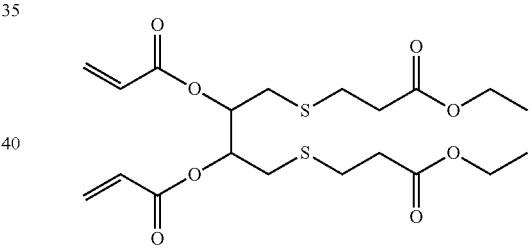

(B1) Photo-polymerization Initiator: IRGACURE379EG (manufactured by BASF)
(B2) Photo-polymerization Initiator: IRGACURE-OXE01 (manufactured by BASF)

The viscosities of (A3) and (A5) at 25° C. each were 230.1 mPa·s and 32.7 mPa·s. (A4), (B1) and (B2) were in the form of solid at 25° C.
(C1) Fluorine-containing surfactant: Megafac F176 (from Dainippon Ink and Chemicals, Inc.)
(C2) Silicone-based surfactant: Polysiloxane polymer KP-341 (from Shin-Etsu Chemical Co., Ltd.)
(S1) Solvent: Propylene glycol monomethyl ether acetate (PGMEA)
(S2) Solvent: γ-Butyrolactone
(S3) Solvent: Cyclohexanone
(S4) Solvent: Propylene glycol monomethyl ether (PGME)
(S5) Solvent: Ethyl lactate
(S6) Solvent: 2-Heptanone
(S7) Solvent: Propylene carbonate
(S8) Solvent: Diisopentyl ether Production of Curable Compositions for Imprints The individual components were mixed according to the ratios of mixing listed in Tables below, to thereby prepare liquid (D) and liquid (D'). The thus-obtained liquids were allowed to pass through the filters listed in Tables below. In the formulations for which two species of liquid (D) and liquid (D') were prepared, the both were mixed. Then the compounds listed in Tables were added after the filtration. After the addition, the mixtures were allowed to pass through the filters listed in Tables below, to thereby obtain the curable compositions for imprints. Pressure applied in this process was adjusted so as to keep the flow rate at 0.05 L/min. Viscosity was measured similarly to the method described in the above.

TABLE 1

|  | Liquid (D) | | | | Liquid (D') | | | |
|---|---|---|---|---|---|---|---|---|
|  | Sort | Amount | Filter/Number of times of Filtration | Viscosity | Sort | Amount | Filter/Number of times of Filtration | Viscosity |
| Example 1 | (A1)(B1) | 49/1 | A/1 | 9.6 | — | — | — | — |
| Example 2 | (A1)(A2)(B2) | 25/24/1 | B/1 | 10.1 | — | — | — | — |
| Example 3 | (A1)(A2)(A3) | 20/25/5 | C/1 | 11.8 | — | — | — | — |
| Example 4 | (A1)(A4) | 49/1 | D/1 | 9.6 | — | — | — | — |
| Example 5 | (A2)(A3)(B1) | 43/5/2 | E/1 | 10.4 | — | — | — | — |
| Example 6 | (A2)(B2) | 49/1 | F/1 | 10.7 | — | — | — | — |
| Example 7 | (A1) | 50 | G/1 | 9.5 | (A2) | 50 | G/1 | 10.3 |
| Example 8 | (A1) | 50 | H/1 | 9.5 | (A2)(A3) | 45/5 | H/1 | 10.5 |
| Example 9 | (A2)(B1) | 49/1 | A/2 | 10.6 | (A1)(A4) | 48/2 | A/2 | 9.8 |
| Example 10 | (A1)(A4)(B2) | 47/1/2 | B/2 | 9.7 | — | — | — | — |
| Example 11 | (A2)(A3) | 45/5 | C/3 | 11.2 | — | — | — | — |
| Example 12 | (A2) | 50 | D/3 | 10.3 | — | — | — | — |
| Example 13 | (A1)(B1) | 48/2 | E/2 | 9.8 | — | — | — | — |
| Example 14 | (A1)(A2)(B2) | 25/25/1 | F/3 | 10.2 | — | — | — | — |
| Example 15 | (A1)(A2)(A3) | 20/25/5 | A/1 | 9.9 | — | — | — | — |
| Example 16 | (A1)(A4) | 49/1 | B/1 | 9.6 | (A2) | 50 | B/1 | 10.3 |
| Example 17 | (A3)(A5)(B1) | 5/43/2 | C/1 | 49.1 | (A1) | 50 | C/1 | 9.5 |
| Example 18 | (A1)(A5)(B2) | 22/24/4 | D/1 | 23.6 | (A2) | 50 | D/1 | 10.3 |
| Comp. Example 1 | — | — | — | — | — | — | — | — |
| Comp. Example 2 | (S4) | 1000 | E/1 | — | — | — | — | — |
| Comp. Example 3 | — | — | — | — | — | — | — | — |
| Comp. Example 4 | (S6) | 1000 | F/1 | — | — | — | — | — |

|  | Unfiltered compounds (E) | | Mixure ratio of | Filter/Number of times of Filtration prepared after the |
|---|---|---|---|---|
|  | Sort | Amount | (D)/(D')/(E) | composition |
| Example 1 | (A3)(S1) | 1/1000 | 40/—/1000 | A/1 |
| Example 2 | (A4)(S2) | 5/1000 | 40/—/1000 | B/1 |
| Example 3 | (B1)(S3) | 1/1000 | 40/—/1000 | C/1 |
| Example 4 | (A2)(B2)(S4) | 30/1/1000 | 20/—/1000 | D/1 |
| Example 5 | (A1)(S5) | 30/1000 | 20/—/1000 | E/1 |
| Example 6 | (A1)(A4)(S6) | 30/1/1000 | 20/—/1000 | F/1 |
| Example 7 | (A3)(B1)(S7) | 30/1/1000 | 20/20/1000 | A/1 |
| Example 8 | (A4)(B2)(S8) | 30/1/1000 | 20/20/1000 | B/1 |
| Example 9 | (S1) | 1000 | 20/20/1000 | C/1 |
| Example 10 | (A2)(S2) | 30/1000 | 20/—/1000 | D/1 |
| Example 11 | (A1)(B1)(S3) | 30/1/1000 | 20/—/1000 | E/1 |
| Example 12 | (A1)(A4)(B2)(S4) | 30/1/1/1000 | 20/—/1000 | F/1 |
| Example 13 | (A3)(C1)(S5) | 5/1/1000 | 40/—/1000 | A/1 |
| Example 14 | (A4)(C2)(S6) | 1/1/1000 | 40/—/1000 | B/1 |
| Example 15 | (B1)(S7) | 1/1000 | 40/—/1000 | C/1 |
| Example 16 | (B2)(S8) | 1/1000 | 20/20/1000 | D/1 |
| Example 17 | (S1) | 1000 | 20/20/1000 | E/1 |
| Example 18 | (S2) | 1000 | 20/20/1000 | F/1 |
| Comp. Example 1 | (A1)(A3)(B1)(S3) | 40/5/1/1000 | — | A/1 |
| Comp. Example 2 | (A1)(A4)(B1) | 48/1/1 | 1000/—/40 | B/1 |
| Comp. Example 3 | (A2)(A4)(B2)(S5) | 40/1/1/1000 | — | C/1 |
| Comp. Example 4 | (A2)(A3)(B2) | 44/5/1 | 1000/—/40 | D/1 |

TABLE 2

| Filter | Effective filration area | Pore size | Filter material | Shape of Filter | Product name and Manufacturer |
|---|---|---|---|---|---|
| Filter A | 600 | 0.2 | UPE | Cartridge formed by pleating a filter | Optimizer D600 manufactured by Nihon Entegris K.K. |
| Filter B | 300 | 0.05 | UPE | Cartridge formed by pleating a filter | Optimizer D300 manufactured by Nihon Entegris K.K. |
| Filter C | 1500 | 0.03 | UPE | Cartridge formed by pleating a filter | Optimizer D manufactured by Nihon Entegris K.K. |
| Filter D | 3000 | 0.1 | UPE | Cartridge formed by pleating a filter | Optimizer DPR-F manufactured by Nihon Entegris K.K. |
| Filter E | 3600 | 0.1 | PTFE | Cartridge formed by pleating a filter | Fluorgard AT manufactured by Nihon Entegris K.K. |
| Filter F | 1200 | 0.2 | UPE | Cartridge formed by pleating a filter | Impact 2 V2 manufactured by Nihon Entegris K.K. |
| Filter G | 17 | 0.1 | UPE | Disk type | UPE disk filter CWAV04700 manufactured by Nihon Entegris K.K. |
| Filter H | 17 | 0.1 | PTFE | Disk type | PTFE disk filter PTAL04700 manufactured by Nihon Entegris K.K. |

In the above tables, the unit of the amount is g, the unit of the viscosity is mPa·s, the unit of the effective filtration area is cm$^2$, and the unit of the pore size is μm.

UPE represents ultra-high-molecular-weight polyethylene, and PTFE represents polytetrafluoroethylene. Total flow volume of each curable composition for imprints was adjusted to 1 L.

The obtained compositions were subjected to evaluations below.

<Time-Dependent Stability>

The obtained curable compositions were allowed to stand in darkness at the individual temperatures of 4° C., 23° C., 30° C. and 45° C. for 180 days, and the number of particles in the liquid was counted using a particle counter KS-41 from Rion Co., Ltd. The number of increase of particles calculated by the equation below was evaluated.

Number of increase of particles=(Number of particles after elapse of certain time)−(Initial number of particles)

Number of particles was measures as density of particles of 0.25 μm or larger per 1 ml of the curable composition, and evaluated according to the criteria below:

A: less than 1;
B: 1 or more and less than 5; and
C: 5 or more.

Results are shown in Table below. Table shows the results of evaluation obtained after storage at 4° C., 23° C., 30° C. and 45° C. in this order.

<Coating Defects>

Each of the curable compositions prepared in the above was spin-coated over an 8-inch silicon substrate so as to form a coated film, and the coated film was allowed to cure under irradiation at 365 nm using a mercury lamp, at an illuminance of 10 mW/cm$^2$, and an energy of exposure of 200 mJ/cm$^2$, to thereby obtain a 100-nm-thick cured film. Defects in the wafers in the individual Examples were detected by observing the individual cured films using a defect inspection device KLA2360 (trade name) from KLA-Tencor Corporation in random mode, while setting the pixel size of the defect inspection device to 0.25 μm and the threshold value to 10.

The results were evaluated according to the criteria below:

A: defect density smaller than 0.01/cm$^2$;
B: 0.01/cm$^2$ or larger and smaller than 0.1/cm$^2$;
C: 0.1/cm$^2$ or larger and smaller than 1/cm$^2$;
D: 1/cm$^2$ or larger and smaller than 10/cm$^2$; and
E: 10/cm$^2$ or larger.

<Lifting or Separation of Pattern>

Each of the curable compositions prepared in the above was spin-coated over an 8-inch silicon substrate to thereby form a coated film of 100 nm thick. A mold, which has a 40-nm 1/1 line- and space pattern with grooves of 80 nm deep, and has a mold-releasing surface finish with a silane coupling agent (Optool HD1100, from Daikin Industries, Ltd.) with a perfluoropolyether structure, was pressed against the composition at a pressure of 1 MPa under nitrogen gas flow. The composition was then allowed to cure under irradiation of light of mercury lamp covering a band around 365 nm, at an illuminance of 10 mW/cm$^2$ and an energy of exposure of 200 mJ/cm$^2$, and the mold was slowly removed after the curing. The obtained pattern was observed under a scanning microscope, and lifting or separation of the pattern was evaluated according to the criteria below. Results are shown in Table below.

A: Missing of pattern not observed;
B: area with missing of pattern less than 1% of patterned area;
C: area with missing of pattern 1% or more and less than 3% of patterned area;
D: area with missing of pattern 3% or more and less than 10% of patterned area; and
E: area with missing of pattern 10% or more.

TABLE 3

| | Time-Dependent Stability | Coating Defects | Lifting or Separation of Pattern |
|---|---|---|---|
| Example 1 | A/A/B/B | B | B |
| Example 2 | A/A/A/B | A | B |
| Example 3 | A/A/A/A | A | A |
| Example 4 | A/A/A/B | B | B |
| Example 5 | A/A/A/B | B | B |
| Example 6 | A/A/B/B | B | B |
| Example 7 | A/A/B/B | C | C |
| Example 8 | A/B/B/B | B | C |
| Example 9 | A/A/A/A | B | A |
| Example 10 | A/A/A/A | B | B |
| Example 11 | A/A/A/A | A | A |
| Example 12 | A/A/A/A | A | A |
| Example 13 | A/A/A/A | A | B |
| Example 14 | A/A/A/B | B | B |
| Example 15 | A/A/A/B | B | B |
| Example 16 | A/B/B/B | B | B |
| Example 17 | A/A/A/A | A | B |
| Example 18 | A/A/A/A | A | B |
| Comp. Example 1 | C/C/C/C | E | E |
| Comp. Example 2 | B/C/C/C | E | E |
| Comp. Example 3 | C/C/C/C | E | D |
| Comp. Example 4 | B/C/C/C | E | D |

As is clear from Table in the above, lifting or separation of the pattern was found to be suppressed by adopting the method of production of the present invention. The present invention was concurrently found to be excellent both in the coatability and suppression of particle formation over time.

The present disclosure relates to the subject matter contained in Japanese Patent Application No. 029436/2011 filed on Feb. 15, 2011, which is expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A method of producing a curable composition for imprints which includes (A) a polymerizable monomer, (B) a polymerization initiator, and (C) a solvent, comprising preparing one species of liquid (D) which contains either the polymerizable monomer (A) or both of the polymerizable monomer (A) and the polymerization initiator (B), passing the liquid (D) through a filter, and then adding the solvent (C); or comprising preparing two or more species of liquid (D) each of which contains either the polymerizable monomer (A) or both of the polymerizable monomer (A) and the polymerization initiator (B), passing each of the liquids (D) through a filter, and then mixing the liquids (D) together with the solvent (C).

2. The method of producing a curable composition for imprints according to claim 1, wherein both the polymerizable monomer (A) and the polymerization initiator (B) are incorporated into the liquid (D) before the liquid (D) is passed through the filter.

3. The method of producing a curable composition for imprints according to claim 1, wherein at least one of the filters has a pore size of 0.1 μm or smaller.

4. The method of producing a curable composition for imprints according to claim 1, wherein at least one of the filters has an effective filtration area of 200 cm² or larger.

5. The method of producing a curable composition for imprints according to claim 1, wherein at least one of the filters is a filter cartridge formed by pleating a membrane filter.

6. The method of producing a curable composition for imprints according to claim 1, wherein the polymerizable monomer (A) is a polymerizable monomer having an aromatic structure and/or an alicyclic hydrocarbon structure.

7. The method of producing a curable composition for imprints according to claim 1, wherein the polymerizable monomer (A) contains a fluorine atom and/or a silicon atom.

8. The method of producing a curable composition for imprints according to claim 1, wherein the liquid (D) has a viscosity at 25° C. of 3 to 50 mPa·s.

9. The method of producing a curable composition for imprints according to claim 1, wherein the liquid (D) is filtered at least twice.

10. The method of producing a curable composition for imprints according to claim 1, which further comprises passing the curable composition obtained after addition of the solvent (C) through a filter.

11. The method of producing a curable composition for imprints according to claim 1, which comprises preparing one species of liquid (D) containing either the polymerizable monomer (A) or both of the polymerizable monomer (A) and the polymerization initiator (B), passing the liquid (D) through a filter, and then adding the solvent (C).

12. The method of producing a curable composition for imprints according to claim 1, which comprises preparing the liquid (D) by adding all components, other than the solvent (C), of the curable composition for imprints, passing the liquid (D) through the filter, and then adding the solvent (C) to the liquid (D).

13. The method of producing a curable composition for imprints according to claim 1, wherein all the filters have pore sizes of 0.1 μm or smaller.

14. The method of producing a curable composition for imprints according to claim 1, wherein at least one of the filters is a fluorine-containing resin based filter or a polyethylene based filter.

15. The method of producing a curable composition for imprints according to claim 1, wherein the polymerizable monomer (A) is a (meth)acrylate.

16. The method of producing a curable composition for imprints according to claim 1, wherein the curable composition for imprints includes both of a (meth)acrylate having an aromatic structure and/or an alicyclic hydrocarbon structure, and a (meth)acrylate containing a fluorine atom and/or a silicon atom as the polymerizable monomer (A).

17. The method of producing a curable composition for imprints according to claim 1, wherein at least one species of the liquid (D) contains at least one kind of the polymerizable monomer (A) and is free from the polymerization initiator (B).

18. The method of producing a curable composition for imprints according to claim 1, which comprises preparing two or more species of liquid (D) each of which contains either the polymerizable monomer (A) or both of the polymerizable monomer (A) and the polymerization initiator (B), passing each of the liquids (D) through a filter, and then mixing the liquids (D) together with the solvent (C).

19. The method of producing a curable composition for imprints according to claim 1, wherein after the filtration, a surfactant is added into the liquid (D).

* * * * *